(12) United States Patent
Seo

(10) Patent No.: US 9,159,560 B2
(45) Date of Patent: Oct. 13, 2015

(54) METHODS OF FORMING HOLE PATTERNS OF SEMICONDUCTOR DEVICES

(71) Applicant: Samsung Electronics Co., Ltd., Suwon-Si, Gyeonggi-Do (KR)

(72) Inventor: Jung-Woo Seo, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 186 days.

(21) Appl. No.: 14/043,361

(22) Filed: Oct. 1, 2013

(65) Prior Publication Data

US 2014/0220782 A1 Aug. 7, 2014

(30) Foreign Application Priority Data

Feb. 7, 2013 (KR) .................. 10-2013-0014079

(51) Int. Cl.
*H01L 21/31* (2006.01)
*H01L 21/033* (2006.01)
*H01L 21/3213* (2006.01)

(52) U.S. Cl.
CPC ........ *H01L 21/0337* (2013.01); *H01L 21/0332* (2013.01); *H01L 21/0338* (2013.01); *H01L 21/32139* (2013.01)

(58) Field of Classification Search
None
See application file for complete search history.

(56) References Cited

U.S. PATENT DOCUMENTS

| 7,531,449 B2 | 5/2009 | Park et al. |
| 7,659,208 B2 | 2/2010 | Zhou et al. |
| 7,670,260 B2 | 3/2010 | DeMarco |
| 7,737,039 B2 | 6/2010 | Sandhu et al. |
| 2010/0120258 A1* | 5/2010 | Kim ............................. 438/745 |
| 2011/0124196 A1 | 5/2011 | Lee |
| 2011/0294297 A1* | 12/2011 | Sukekawa ..................... 438/703 |
| 2011/0294497 A1 | 12/2011 | Hedlund et al. |
| 2011/0312184 A1* | 12/2011 | Lee et al. ...................... 438/696 |
| 2013/0095663 A1 | 4/2013 | Seo et al. |

FOREIGN PATENT DOCUMENTS

| KR | 2008-0074529 A | 8/2008 |
| KR | 2009-0011901 A | 2/2009 |
| KR | 2009-0069091 A | 6/2009 |
| KR | 10-0942074 B1 | 2/2010 |
| KR | 2013-0041630 A | 4/2013 |

* cited by examiner

*Primary Examiner* — Zandra Smith
*Assistant Examiner* — Molly Reida
(74) *Attorney, Agent, or Firm* — Harness, Dickey & Pierce, P.L.C.

(57) ABSTRACT

A double patterning method of forming a plurality of hole patterns having a small pitch using etch selectivities includes forming a patterning mask pattern defining a preliminary hole exposing an upper surface of a buffer mask layer, an inner spacer exposing the upper surface of the buffer mask layer on an inner wall of the preliminary hole, a buffer mask pattern having a first hole, and a core insulating pattern filling the preliminary hole and the first hole, an outer spacer to expose a first portion of the patterning mask pattern on the exposed portion of the outer side of the inner spacer, and an empty space exposing a first portion of the buffer mask pattern. A second portion of the patterning mask pattern and a second portion of the buffer mask pattern are exposed. A second hole is formed by removing the second portion of the buffer mask pattern.

20 Claims, 34 Drawing Sheets

METHODS OF FORMING HOLE PATTERNS OF SEMICONDUCTOR DEVICES

CROSS-REFERENCE TO RELATED APPLICATION

This application claims the benefit of priority under 35 U.S.C. §119 to Korean Patent Application No. 10-2013-0014079 filed on Feb. 7, 2013, the disclosure of which is herein incorporated by reference in their entirety.

BACKGROUND

1. Field

Example embodiments of inventive concepts relate to methods of forming hole patterns of semiconductor devices.

2. Description of Related Art

As the degree of integration of semiconductor devices increases, various double patterning technologies for forming hole patterns having a pitch or a diameter smaller than the minimum resolution of a photolithography process have been suggested.

SUMMARY

Example embodiments of inventive concepts provide methods of forming hole patterns of semiconductor devices.

Example embodiments of inventive concepts provide methods of forming hole patterns having a pitch or a diameter smaller than minimum resolution of a photolithography process.

In accordance with example embodiments of inventive concepts, a method of forming hole patterns of semiconductor devices includes sequentially stacking an upper pattering mask layer, a middle patterning mask layer, a lower patterning mask layer, and an upper buffer mask layer on a target layer. An upper patterning mask pattern, a middle patterning mask pattern, and a lower patterning mask pattern which collectively define a preliminary hole selectively exposing an upper surface of the upper buffer mask layer are formed by selectively removing the upper patterning mask layer, the middle patterning mask layer, and the lower patterning mask layer. An inner spacer exposing a portion of the upper surface of the upper buffer mask layer is formed on an inner wall of the preliminary hole. An upper buffer mask pattern is formed by removing the exposed portion of the upper surface of the upper buffer mask layer using the upper patterning mask pattern and the inner spacer as an etch mask. A core insulating pattern is formed filling the preliminary hole. A portion of an outer side of the inner spacer and the middle patterning mask pattern are exposed by removing the upper patterning mask pattern. An outer spacer is formed on the exposed portion of the outer side of the inner spacer, wherein the outer spacer exposes a portion of the middle patterning mask pattern. A first portion of the lower patterning mask pattern is selectively exposed by removing the exposed portion of the middle patterning mask pattern. An empty space selectively exposing a first portion of the upper buffer mask pattern is formed by removing the exposed first portion of the lower patterning mask pattern. A patterning barrier pattern is formed in the empty space. A second portion of the lower patterning mask pattern is exposed by removing the outer spacer and the middle patterning mask pattern. A second portion of the upper buffer mask pattern is exposed by removing the exposed second portion of the lower patterning mask pattern. The exposed second portion of the upper buffer mask pattern is removed; and then the core insulating pattern, the inner spacer, and the patterning barrier pattern are removed.

The method may further include forming a third hole by removing the first portion of the buffer mask pattern before the forming of the patterning barrier pattern.

The forming of the patterning mask pattern may include, sequentially stacking a lower patterning mask layer, a middle patterning mask layer, and an upper patterning mask layer on the buffer mask layer; and forming an upper patterning mask pattern, a middle patterning mask pattern, and a lower patterning mask pattern by selectively removing the upper patterning mask layer, the middle patterning mask layer, and the lower patterning mask layer.

The exposing of the portion of the outer side of the inner spacer by partially removing the upper portion of the patterning mask pattern may include removing the upper patterning mask pattern.

The removing of the second portion of the patterning mask pattern may include removing a portion of the middle patterning mask pattern and a portion of the lower patterning mask pattern.

The portion of the upper surface of the buffer mask layer may form a bottom surface of the preliminary hole, and the first portion and the second portion of the buffer mask pattern may be disposed outside of the preliminary hole.

The method may further include forming a lower hard mask layer on the upper patterning mask layer, forming an upper hard mask layer on the lower hard mask layer, forming a photoresist pattern on the upper hard mask layer, forming the upper hard mask pattern selectively exposing the lower hard mask layer by selectively removing the upper hard mask layer using the photoresist pattern as an etch mask, and forming the lower hard mask pattern selectively exposing the upper patterning mask layer by selectively removing the lower hard mask layer using the upper hard mask pattern as an etch mask.

The lower hard mask pattern may include a carbon polymer, and the upper hard mask pattern includes a silicon oxynitride layer.

The method may further include, between the target layer and the upper buffer mask layer, forming the lower buffer mask layer and a middle buffer mask layer, forming a middle buffer mask pattern by selectively removing the middle buffer mask layer using the upper buffer mask pattern as an etch mask, and forming a lower buffer mask pattern by selectively removing the lower buffer mask layer using the middle buffer mask pattern as an etch mask.

The upper buffer mask layer and the lower buffer mask layer may include polycrystalline silicon, and the middle buffer mask layer may include silicon oxide.

The selectively exposing of the first portion of the upper buffer mask pattern may include removing a portion of the lower patterning mask pattern disposed below the middle patterning mask pattern.

The exposing of the second portion of the lower patterning mask pattern may include partially removing an upper portion of the core insulating pattern and an upper portion of the inner spacer.

The upper patterning mask layer and the lower patterning mask layer may include silicon oxide.

The middle patterning mask layer, the inner spacer, the outer spacer, the core insulating pattern, and the patterning barrier pattern may include silicon nitride.

In accordance with example embodiments of inventive concepts, a method of forming hole patterns of semiconductor devices includes forming a buffer mask layer on a target layer; forming a patterning mask pattern defining a preliminary hole exposing an upper surface of the buffer mask layer; and forming an inner spacer exposing a first portion of the upper surface of the buffer mask layer on an inner wall of the preliminary hole. A buffer mask pattern having a first hole is formed by removing the portion of the upper surface of the buffer mask layer exposed in the preliminary hole using the patterning mask pattern and the inner spacer as an etch mask. A core insulating pattern is formed filling the preliminary hole and the first hole. A portion of an outer side of the inner spacer is exposed by partially removing an upper portion of the patterning mask pattern. An outer spacer is formed to expose a first portion of the patterning mask pattern on the exposed outer side of the inner spacer. An empty space exposing a first portion of the buffer mask pattern is formed by partially removing the patterning mask pattern using the outer spacer as an etch mask. A patterning barrier pattern is formed in the empty space. A second portion of the patterning mask pattern is exposed by removing the outer spacer. A second portion of the buffer mask pattern is exposed by removing the second portion of the patterning mask pattern using the inner spacer and the core insulating pattern as an etch mask. A second hole is formed by removing the second portion of the buffer mask pattern.

In accordance with example embodiments, there is provide a method of forming hole patterns including providing a buffer mask layer and a patterning mask pattern sequentially stacked over an upper surface of a target layer, wherein the buffer mask layer defines a bottom surface of a preliminary hole, and the patterning mask pattern defines sidewalls of the preliminary hole. Inner spacers are formed each on a first portion of the buffer mask layer and each covering one of the sidewalls of the preliminary hole. A first buffer mask pattern is formed by removing a second portion of the buffer mask layer using the patterning mask pattern and the inner spacers as an etch mask, wherein the second portion of the buffer mask layer excludes the first portion of the buffer mask layer. A core insulating pattern is formed filling the preliminary holes and areas between the first buffer mask pattern. A sidewall of each of inner spacers is exposed by partially removing an upper portion of the patterning mask pattern. Outer spacers are formed on the exposed sidewalls of the inner spacers, wherein the outer spacers expose a middle portion of the patterning mask pattern. An empty space is formed by partially removing the middle portion and a bottom portion of the patterning mask pattern using the outer spacers as an etch mask. A patterning barrier pattern is formed in the empty space, and a second buffer mask pattern is formed by separately etching a top surface and a bottom surface of a remaining portion of the buffer mask layer using the first buffer mask pattern as an etching mask.

The outer spacers may be each formed having a width less than a width of each of the inner spacers, and the exposed middle portion of the patterning mask pattern may have a substantially triangular shape in plan view.

The forming outer spacers may include forming an outer spacer material layer partially filling in a substantial portion of an area between the exposed sidewalls of the inner spacers. The exposed middle portion of the patterning mask pattern may have a substantially square shape in plan view.

The second buffer mask pattern may have a plurality of holes collectively forming a repeating pattern in plan view wherein the repeating pattern consists of a first hole having a substantially circle shape in plan view and a plurality of second holes encircling the first hole. The plurality of second holes may be identical and each may have a substantially rectangular shape in plan view.

The second buffer mask pattern may have a plurality of holes collectively forming a repeating pattern in plan view wherein the repeating pattern consists of a first hole having a substantially circle shape in plan view and a plurality of second holes encircling the first hole. The plurality of second holes may consist of alternating square-shaped holes and triangular-shaped holes in plan view.

Details of other example embodiments are included in the detailed description and drawings.

BRIEF DESCRIPTION OF THE DRAWINGS

The foregoing and other features and advantages of inventive concepts will be apparent from the more particular description of preferred example embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIGS. 1A to 7B are layout diagrams and longitudinal cross-sectional views illustrating a method of fabricating a semiconductor device according to example embodiments of inventive concepts, wherein FIGS. 1A, 2A, 3A, 4A, 5A, 6A, 7A, and 7B are layout diagrams illustrating the method of fabricating a semiconductor device according to example embodiments of inventive concepts

FIGS. 8A to 15 are layout diagrams and longitudinal cross-sectional views illustrating a method of fabricating a semiconductor device according to example embodiments of inventive concepts, wherein FIGS. 8A, 9A, 10A, 11A, 12A, 13A, 14A, and 15 are layout diagrams illustrating the method of fabricating a semiconductor device according to example embodiments of inventive concepts

DETAILED DESCRIPTION OF EXAMPLE EMBODIMENTS

Figure 1A:
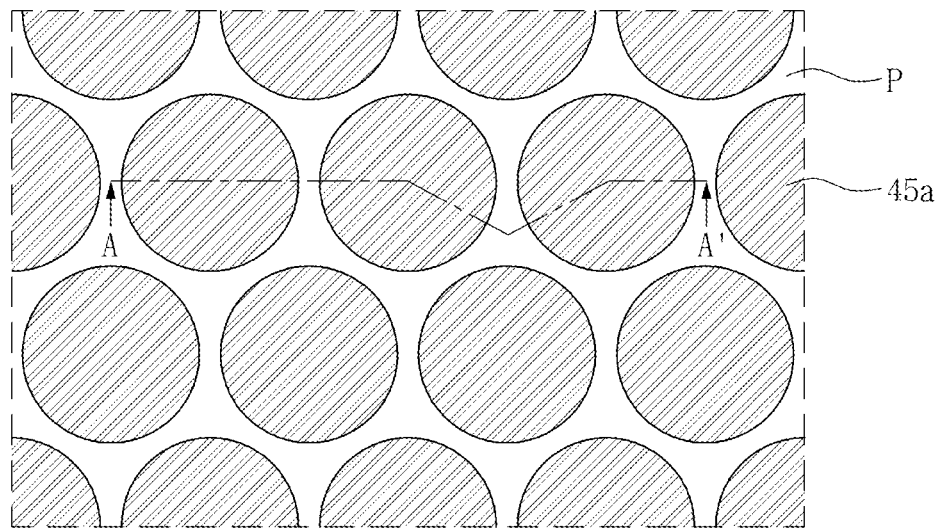

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of inventive concepts provide methods of forming hole patterns of semiconductor devices.

Figure 1B:
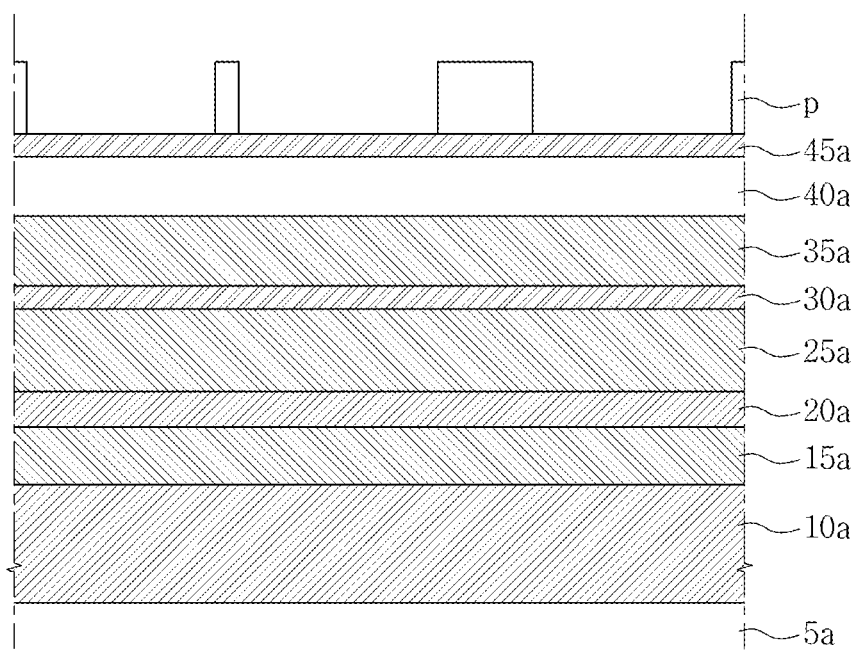
FIGS. 1B to 1H, 2B to 2F, 3B to 3D, 4B to 4D, 5B to 5C, and 6B are longitudinal cross-sectional views taken along line A-A' of FIGS. 1A, 2A, 3A, 4A, 5A, and 6A.

Referring to FIGS. 1A and 1B, a method of fabricating a semiconductor device according to example embodiments of inventive concepts may include sequentially forming a lower buffer mask layer 10a, a middle buffer mask layer 15a, an upper buffer mask layer 20a, a lower patterning mask layer 25a, a middle patterning mask layer 30a, an upper patterning mask layer 35a, a lower hard mask layer 40a, and an upper hard mask layer 45a on a target layer 5a in a stacking manner and forming a photoresist pattern P on the upper hard mask layer 45a. For example, the target layer 5a may include silicon nitride.

The lower buffer mask layer 10a may include a material having an etch selectivity to the target layer 5a. For example, the lower buffer mask layer 10a may include polycrystalline silicon or amorphous silicon.

The middle buffer mask layer 15a may include a material having an etch selectivity to the lower buffer mask layer 10a. For example, the middle buffer mask layer 15a may include silicon oxide.

The upper buffer mask layer 20a may include a material having an etch selectivity to the middle buffer mask layer 15a. For example, the upper buffer mask layer 20a may include polycrystalline silicon or amorphous silicon.

The lower patterning mask layer 25a may include a material having an etch selectivity to the upper buffer mask layer 20a. For example, the lower patterning mask layer 25a may include silicon oxide.

The middle patterning mask layer 30a may include a material having an etch selectivity to the lower patterning mask layer 25a. For example, the middle patterning mask layer 30a may include silicon nitride.

The upper patterning mask layer 35a may include a material having an etch selectivity to the middle patterning mask layer 30a. For example, the upper patterning mask layer 35a may include silicon oxide.

The lower hard mask layer 40a may include a material having an etch selectivity to the upper patterning mask layer 35a. For example, the lower hard mask layer 40a may include a polymer containing carbon, for example, such as a spin-on-hard mask (SOH).

The upper hard mask layer 45a may include a material having an etch selectivity to the lower hard mask layer 40a. For example, the upper hard mask layer 45a may include silicon oxynitride (SiON).

The photoresist pattern P may selectively expose the upper hard mask layer 45a.

Figure 1C:
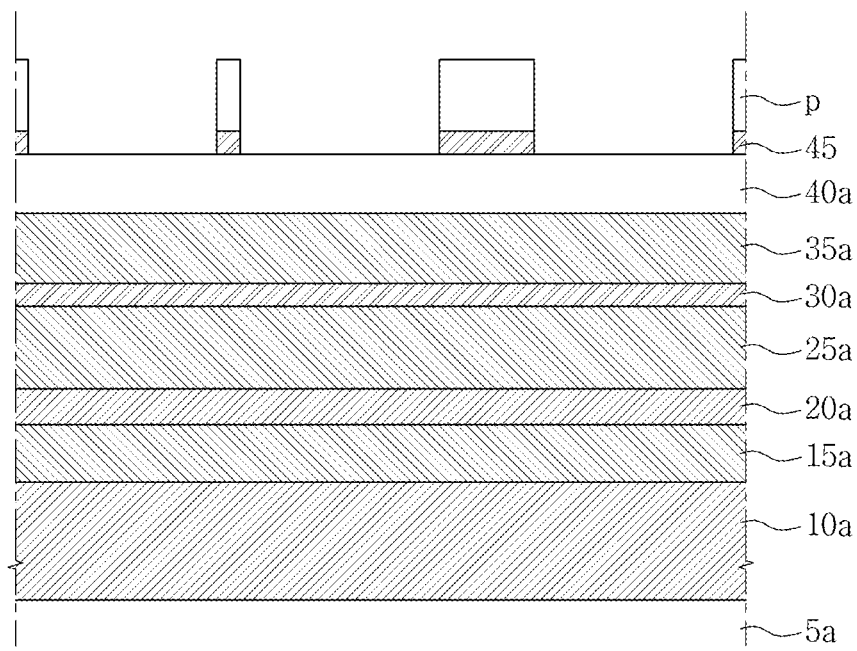

Referring to FIG. 1C, the method may include forming an upper hard mask pattern 45 selectively exposing the lower hard mask layer 40a by selectively removing the upper hard mask layer 45a using the photoresist pattern P as an etch mask.

Figure 1D:
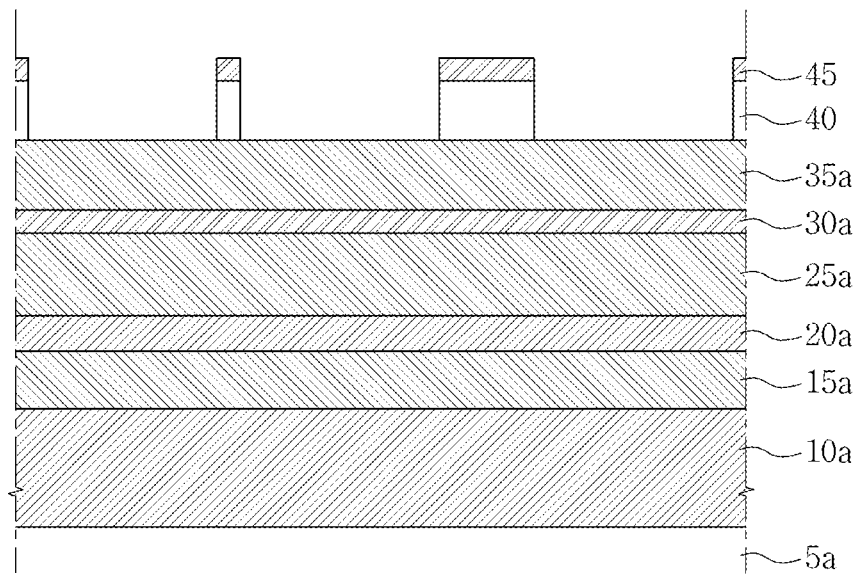

Referring to FIG. 1D, the method may include forming a lower hard mask pattern 40 selectively exposing the upper patterning mask layer 35a by selectively removing the lower hard mask layer 40a using the photoresist patter P and/or the upper hard mask pattern 45 as an etch mask. When both the photoresist pattern P and the lower hard mask layer 40a include a carbon polymer, the photoresist pattern P may not function as an etch mask for etching the lower hard mask layer 40a. For example, the photoresist pattern P and the lower hard mask layer 40a may be simultaneously removed. In the process, the photoresist pattern P may be completely removed.

Figure 1E:
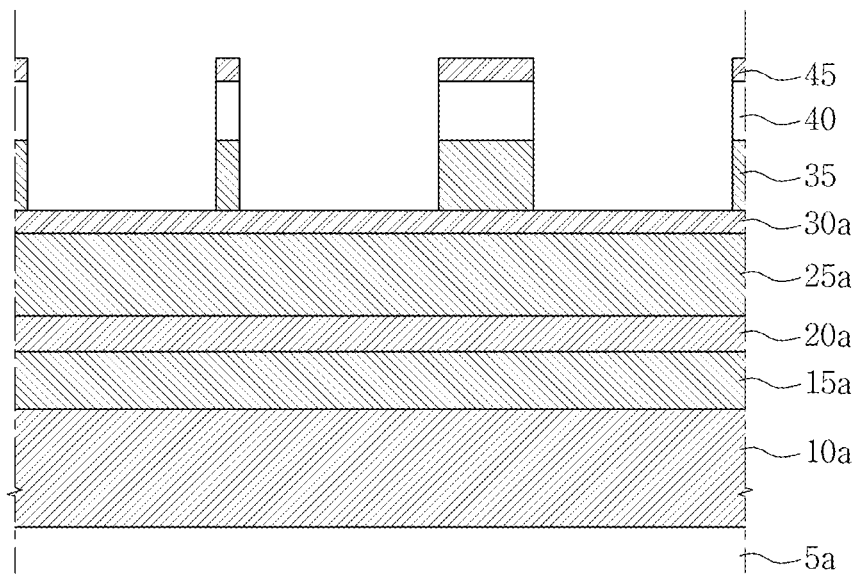

Referring to FIG. 1E, the method may include forming an upper patterning mask pattern 35 selectively exposing the middle patterning mask layer 30a by selectively removing the upper patterning mask layer 35a using the upper hard mask pattern 45 as an etch mask.

Figure 1F:
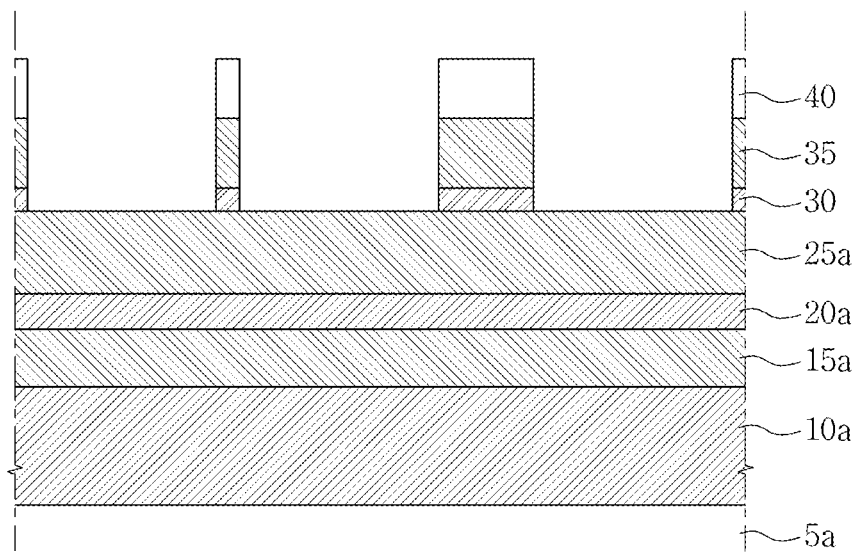

Referring to FIG. 1F, the method may include forming a middle patterning mask pattern 30 selectively exposing the lower patterning mask layer 25a by selectively removing the middle patterning mask layer 30a using the upper hard mask pattern 45 and/or the lower hard mask pattern 40 as an etch mask. When the upper hard mask pattern 45 and the middle patterning mask layer 30a include the same material, the upper hard mask pattern 45 may not function as an etch mask and be removed. In the process, the upper hard mask pattern 45 may be completely removed and the lower hard mask pattern 40 may be thinned.

Figure 1G:
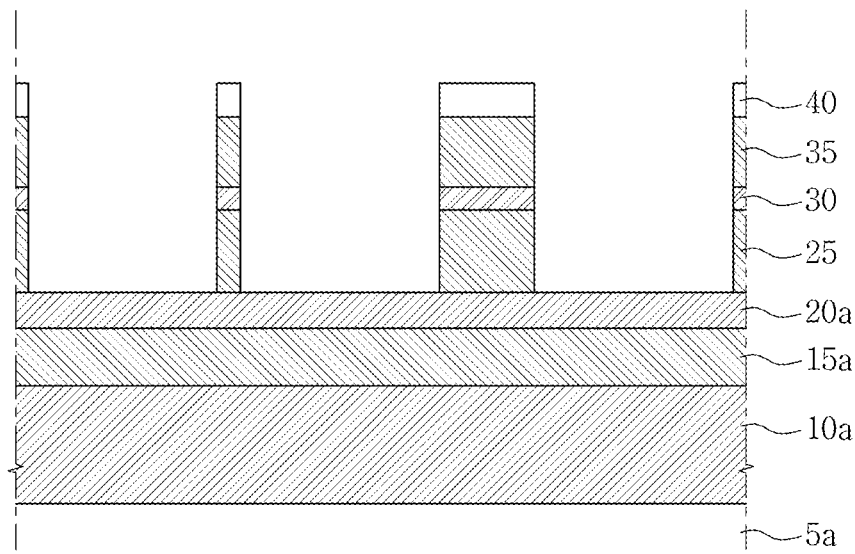

Referring to FIG. 1G, the method may include forming a lower patterning mask pattern 25 selectively exposing the upper buffer mask layer 20a by selectively removing the lower patterning mask layer 25a using the lower hard mask pattern 40 as an etch mask. In the process, the lower hard mask pattern 40 may be further thinned.

Figure 1H:
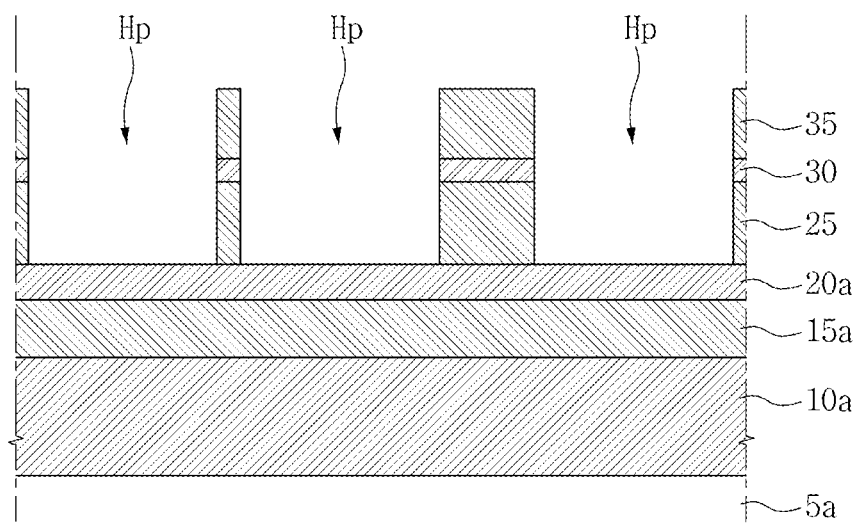

Referring to FIG. 1H, the method may include removing the lower hard mask pattern 40. For example, when the lower hard mask pattern 40 includes a carbon polymer, the lower hard mask pattern 40 may be removed by performing an ashing process using oxygen gas. The upper patterning mask pattern 35, the middle patterning mask pattern 30, and the lower patterning mask pattern 25 may define a preliminary hole Hp.

Figure 2A:
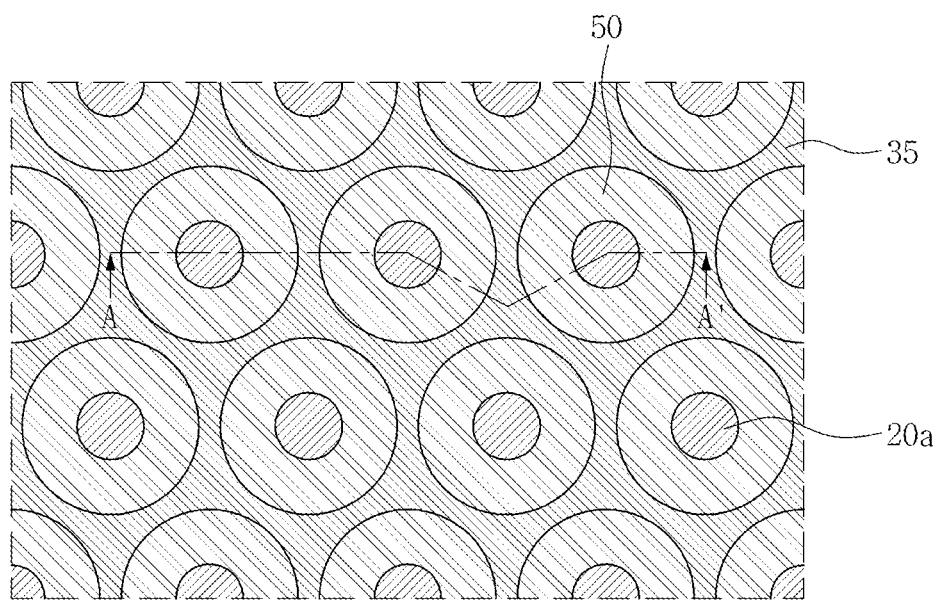
Figure 2B:
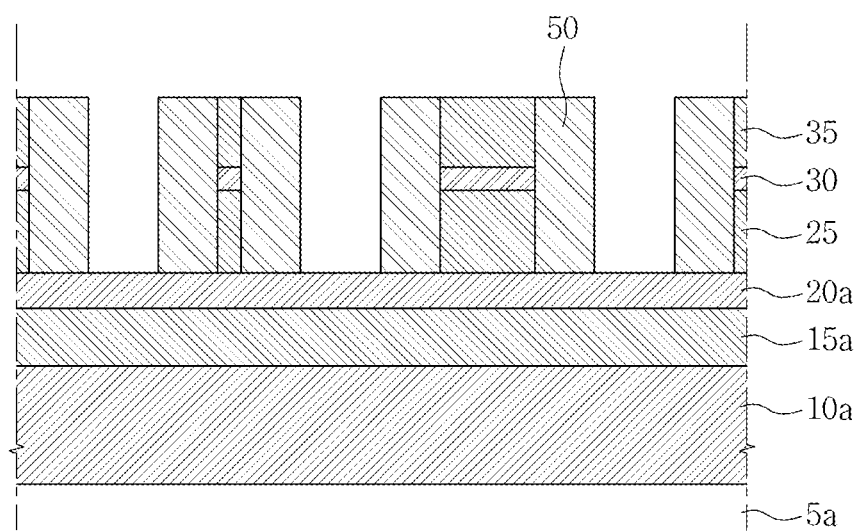

Referring to FIGS. 2A and 2B, the method may include forming an inner spacer 50 in the preliminary hole Hp. The forming of the inner spacer 50 may include entirely forming an inner spacer material layer and performing an etch back process to expose the upper buffer mask layer 20a in the preliminary hole Hp. A portion of an upper surface of the upper buffer mask layer 20a may be selectively exposed in the preliminary hole Hp. The inner spacer 50 may be formed on an inner wall of the preliminary hole Hp in a disc shape. The inner spacer 50 may include silicon nitride.

Figure 2C:
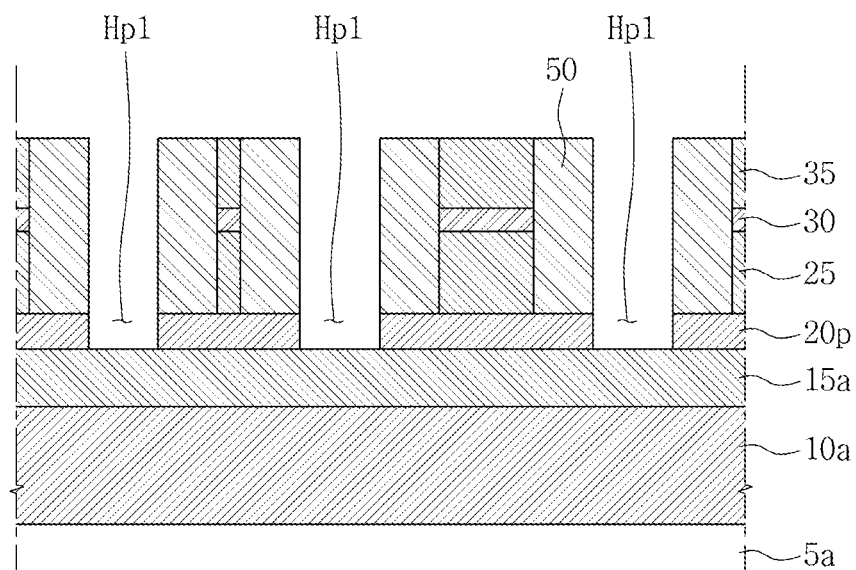

Referring to FIG. 2C, the method may include forming a preliminary upper buffer mask pattern 20p selectively exposing the middle buffer mask layer 15a by selectively removing the upper buffer mask layer 20a using the upper patterning mask pattern 35 and the inner spacer 50 as an etch mask. For example, the preliminary upper buffer mask pattern 20p may have a first preliminary hole Hp1 exposing the middle buffer mask layer 15a.

Figure 2D:
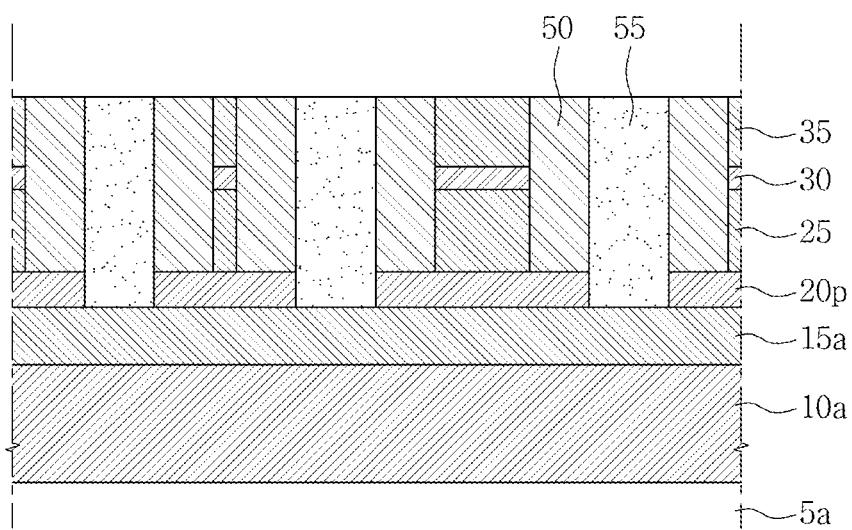

Referring to FIG. 2D, the method may include forming a core insulating pattern 55 in the first preliminary hole Hp1. The forming of the core insulating pattern 55 may include entirely forming a core insulating material to fill the first preliminary hole Hp1 and blanket-etching the core insulating material to expose upper surfaces of the upper patterning mask pattern 35 and inner spacer 50 by performing a planarization process such as an etch back process. The core insulating pattern 55 may include silicon nitride.

Figure 2E:
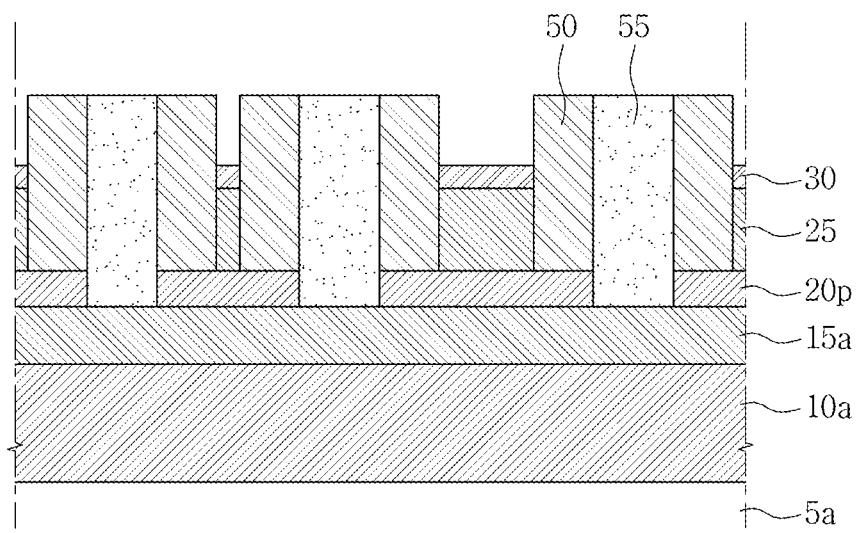

Referring to FIG. 2E, the method may include exposing an upper surface of the middle patterning mask pattern 30 and upper portions of outer sides of the inner spacer 50 by removing the exposed upper patterning mask pattern 35.

Figure 2F:
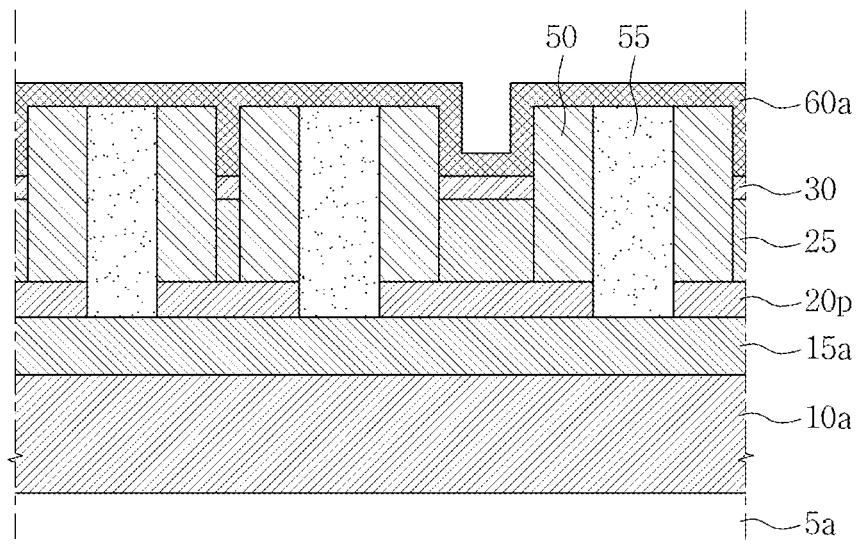

Referring to FIG. 2F, the method may include entirely forming an outer spacer material layer 60a. The outer spacer material layer 60a may be formed to be significantly filled in a relatively narrow region and may be conformably formed in a relatively wide region.

Figure 3A:
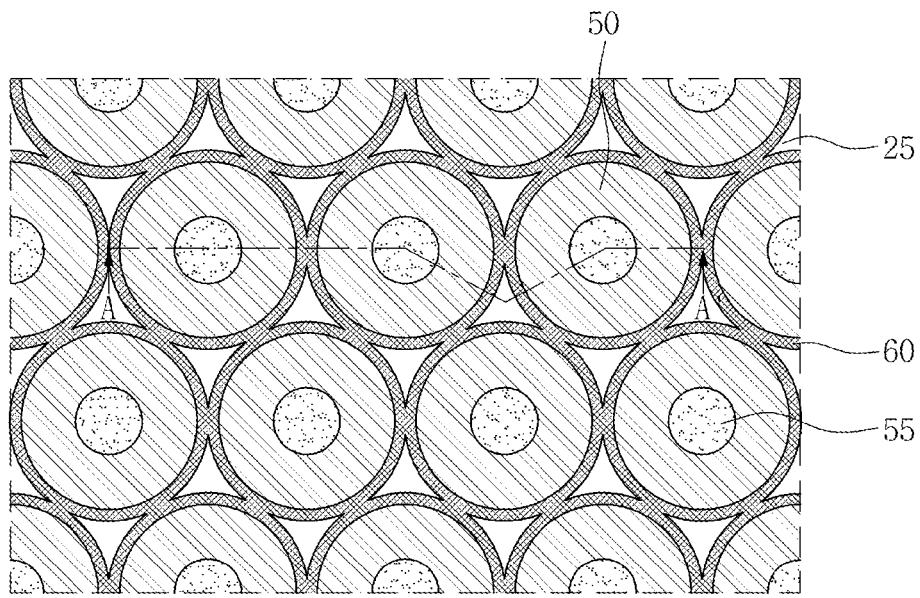
Figure 3B:
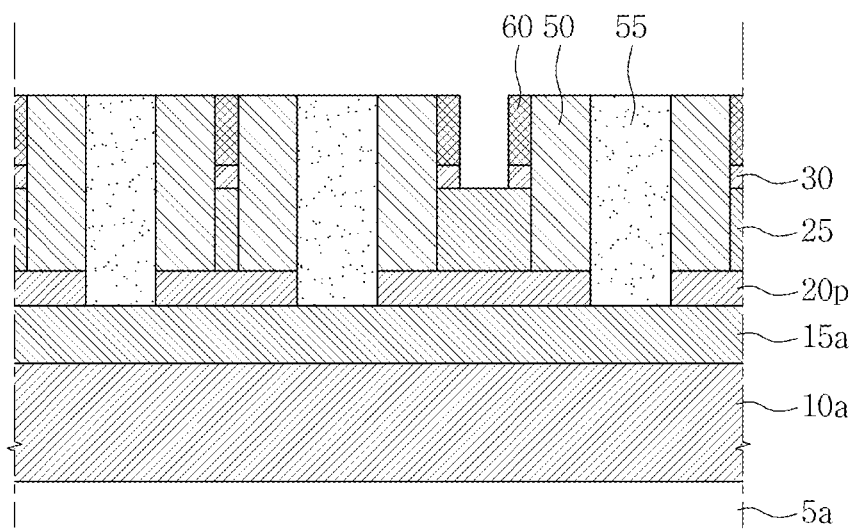

Referring to FIGS. 3A and 3B, the method may include etching back the outer spacer material layer 60a to form an outer spacer 60 exposing an upper surface of the core insulating pattern 55, an upper surface of the inner spacer 50, the upper surface of the middle patterning mask pattern 30, and continuously selectively removing the middle patterning mask pattern 30 exposed by the outer space 60 to selectively expose an upper surface of the lower patterning mask pattern 25. Therefore, the middle patterning mask pattern 30 may be formed to selectively remain below the outer spacer 60. An upper surface of the lower patterning mask pattern 25 may be selectively exposed.

Figure 3C:
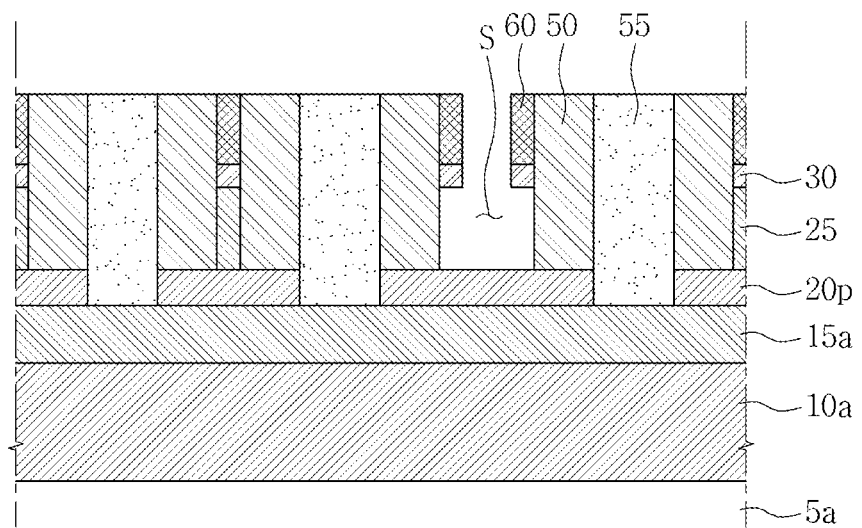

Referring to FIG. 3C, the method may include forming an empty space S by selectively removing the exposed lower patterning mask pattern 25. The process may include performing an isotropic etching process to remove portions of the lower patterning mask pattern 25 disposed below the middle patterning mask pattern 30. The lower patterning mask pattern 25 disposed below the middle patterning mask pattern 30 may be removed to expose an upper surface (or, expand an exposed upper surface) of the preliminary upper buffer mask pattern 20p.

Figure 3D:
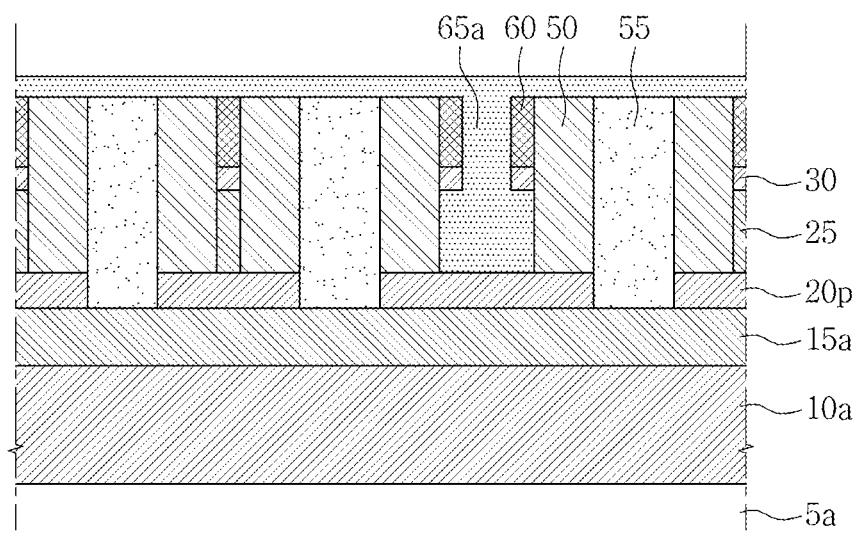

Referring to FIG. 3D, the method may include entirely forming a patterning barrier material layer 65a to fill the empty space S. The patterning barrier material layer 65a may include silicon nitride.

Figure 4A:
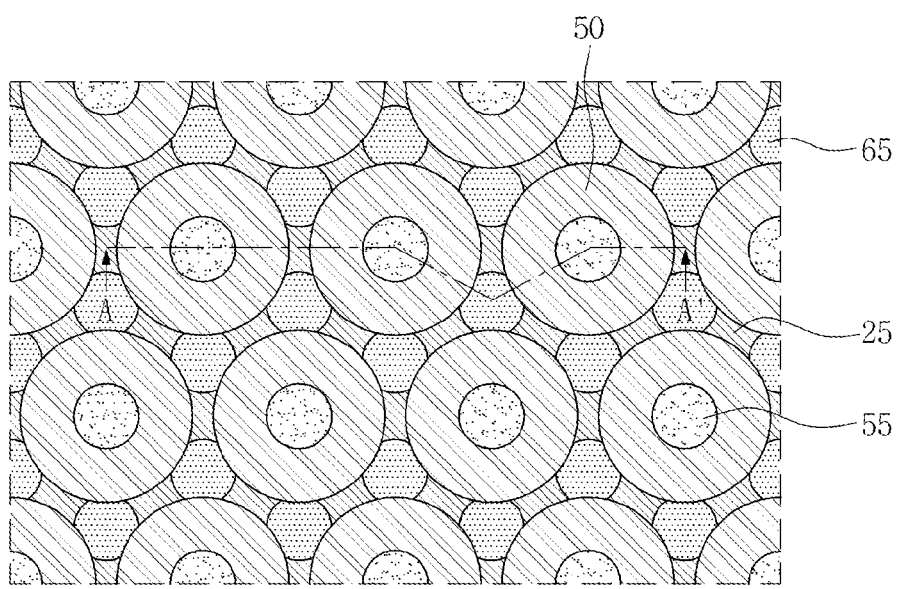
Figure 4B:
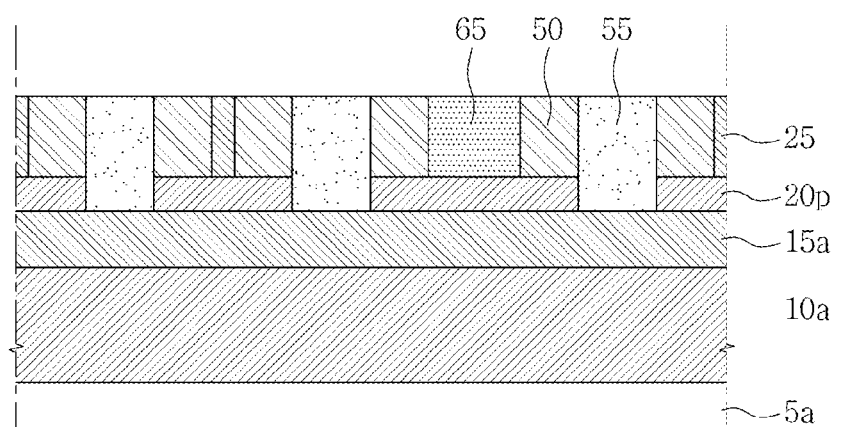

Referring to FIGS. 4A and 4B, the method may include entirely performing an etch back process to expose the lower patterning mask pattern 25. For example, the process may include etching back the inner spacer 50, the core insulating pattern 55, and the patterning barrier material layer 65a to remove the outer spacer 60 and the middle patterning mask pattern 30. In the process, the patterning barrier pattern 65 may be formed. The process may include performing an etching back process for removing the silicon nitride.

Figure 4C:
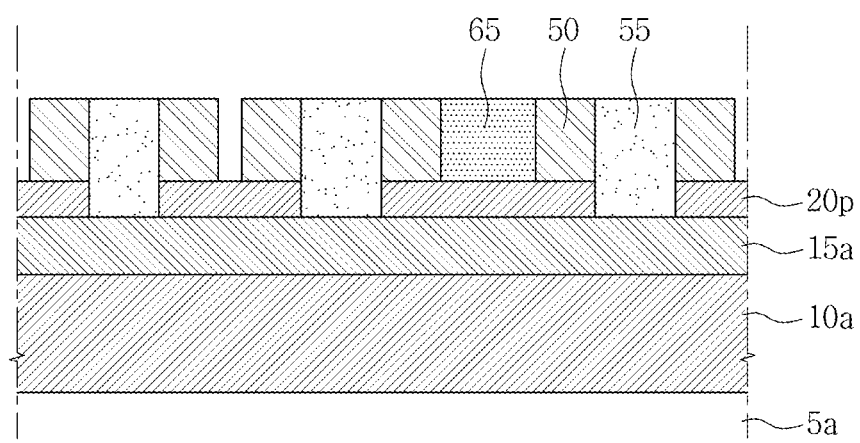

Referring to FIG. 4C, the method may include selectively exposing the preliminary upper buffer mask pattern 20p by removing the exposed lower patterning mask pattern 25.

Figure 4D:
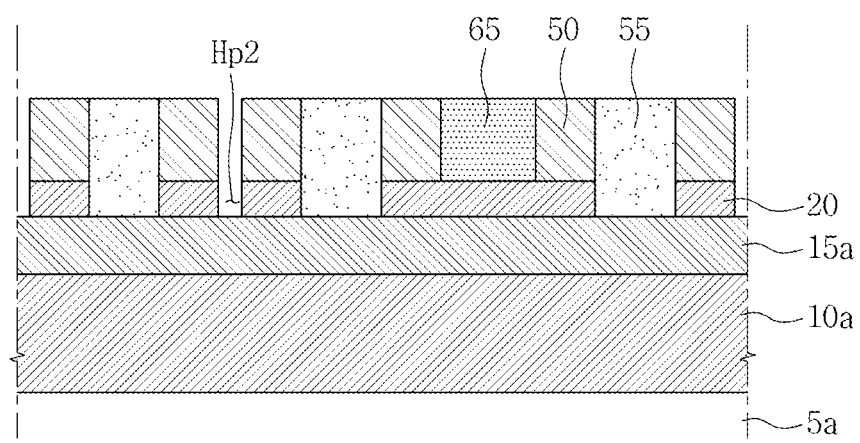

Referring to FIG. 4D, the method may include forming the upper buffer mask pattern 20 further having a second preliminary hole Hp2 exposing the middle buffer mask layer 15a by further selectively removing the exposed preliminary upper buffer mask pattern 20p.

Figure 5A:
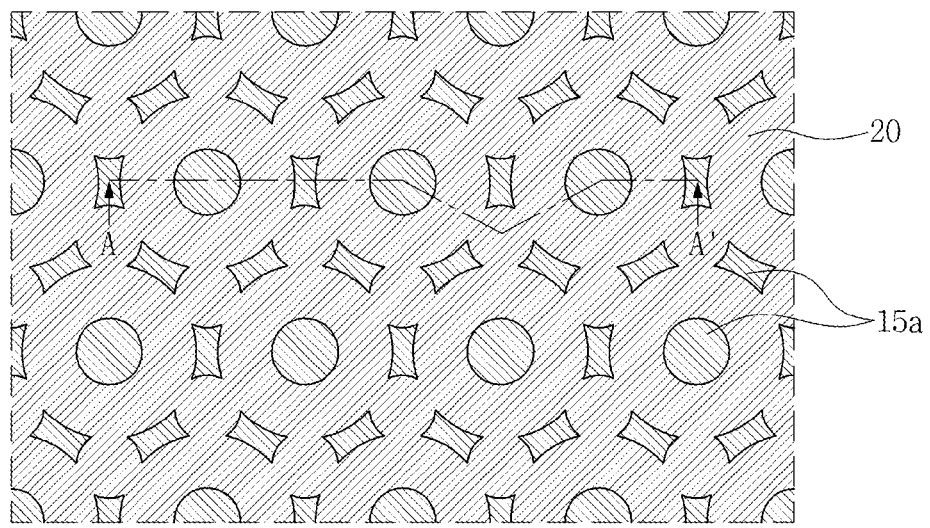
Figure 5B:
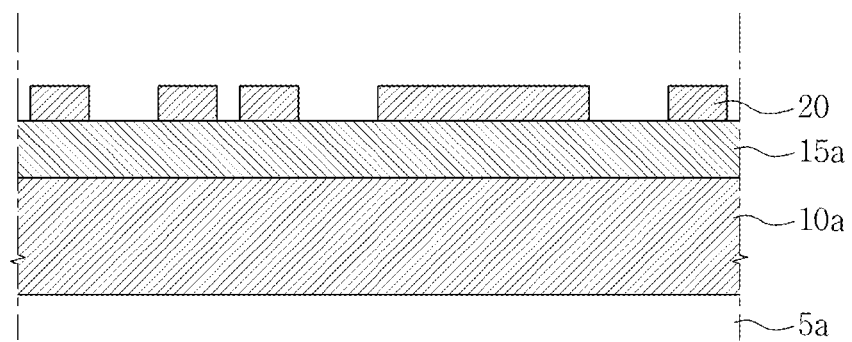

Referring to FIGS. 5A and 5B, the method may include exposing the upper buffer mask pattern 20 and the middle buffer mask layer 15a by removing the core insulating pattern 55, the inner spacer 50, and the patterning barrier pattern 65.

Figure 5C:
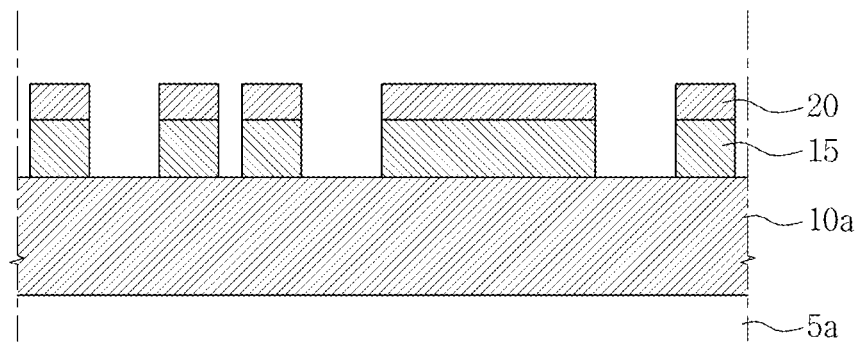

Referring to FIG. 5C, the method may include forming a middle buffer mask pattern 15 selectively exposing the lower buffer mask layer 10a by selectively removing the middle buffer mask layer 15a using the upper buffer mask pattern 20 as an etch mask.

Figure 6A:
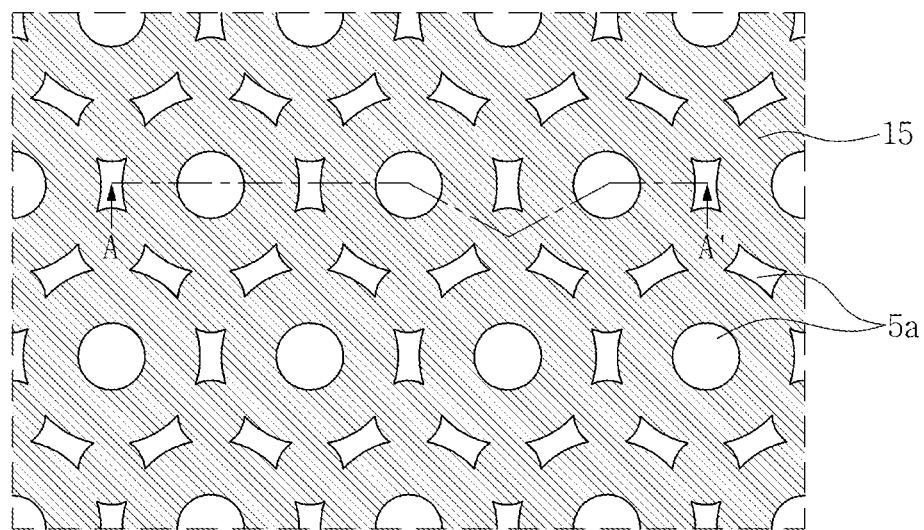
Figure 6B:
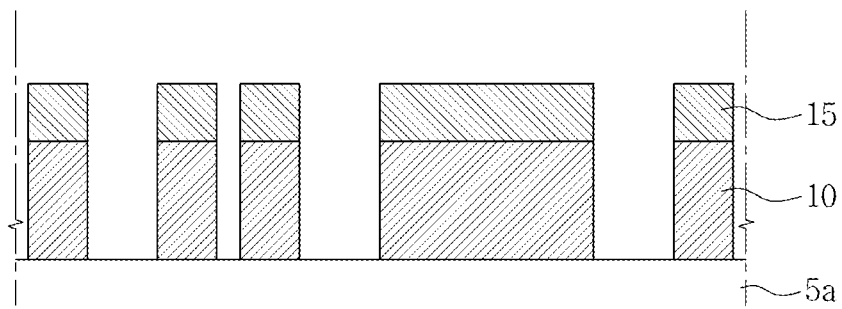

Referring to FIGS. 6A and 6B, the method may include forming a lower buffer mask pattern 10 selectively exposing the target layer 5a using the upper buffer mask pattern 20 and the middle buffer mask pattern 15 as an etch mask. When the upper buffer mask pattern 20 and the lower buffer mask pattern 10 include the same material, the upper buffer mask pattern 20 may not function as an etch mask for etching the lower buffer mask pattern 10. For example, the upper buffer mask pattern 20 may be simultaneously removed while the lower buffer mask pattern 10 is formed.

Figure 7A:
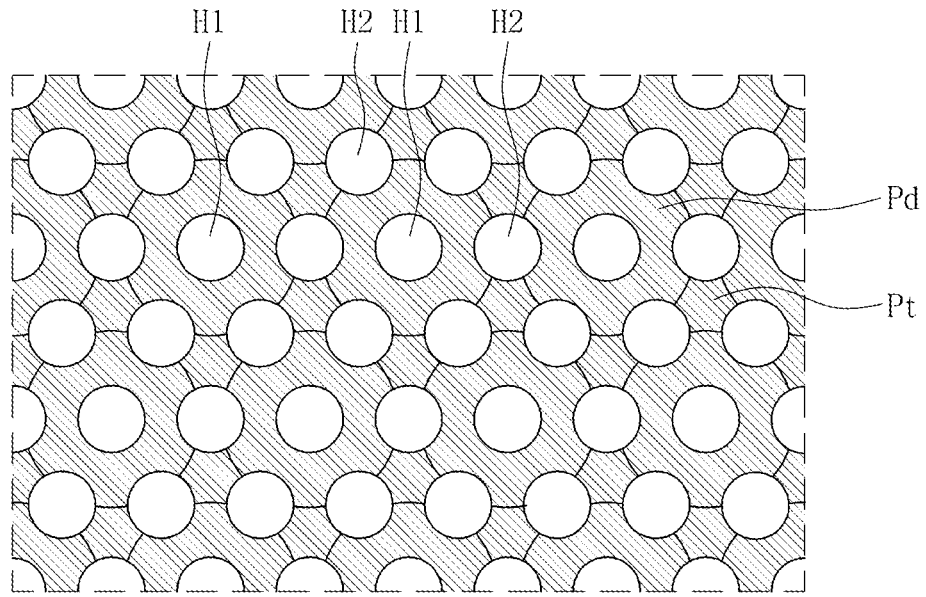
Figure 7B:
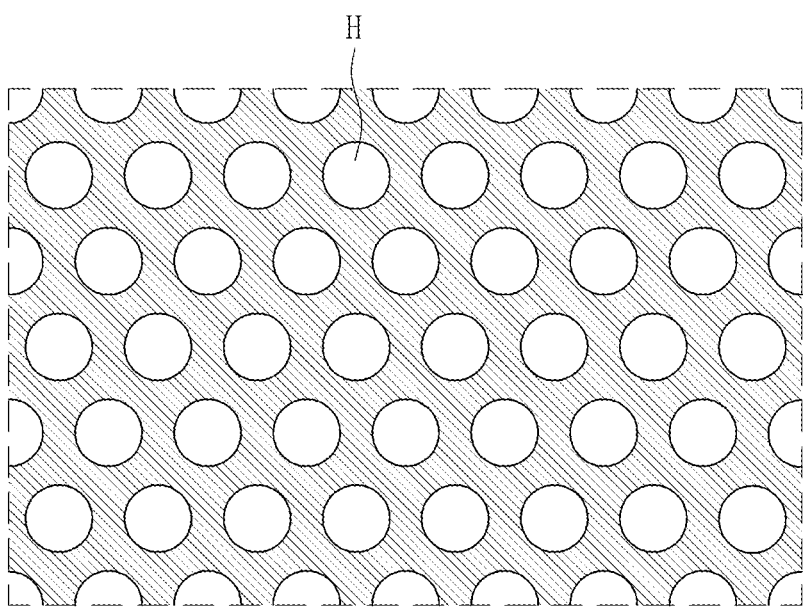

FIG. 7A is a layout diagram substantially interpreting FIG. 6A, and FIG. 7B is a layout diagram in which a boundary between a disc type pattern Pd and a triangular pattern Pt in FIG. 7A is omitted.

Referring to FIG. 7A, the method may include forming a first hole H1 surrounded by the disc type pattern Pd and second holes H2 surrounded by the disc type pattern Pd and the triangular pattern Pt. In FIGS. 1A to 6B, a shape and position of the first hole H1 may be defined by removing the core insulating pattern 55, and a shape and position of the second hole H2 may be defined by removing the outer spacer 60. In ideal layout diagrams, the second hole H2 has a polygonal shape, but the second hole H2 may be modified in a circular shape during the performing of the etching process. The sizes, shapes, and positions of the first and second holes H1 and H2 may be variously applied through process condition control.

Referring to FIG. 7B, the method may provide an arrangement of holes H having a honeycomb shape or alternating shape in zigzags. The disc type pattern Pd and the triangular pattern Pt of FIG. 7A may be regarded as one unitary pattern.

FIGS. 8A to 15 are layout diagrams and longitudinal cross-sectional views illustrating a method of a fabricating a semiconductor device according to example embodiments of inventive concepts. FIGS. 8A, 9A, 10A, 11A, 12A, 13A, 14A, and 15 are layout diagrams illustrating the method of fabricating a semiconductor device according to example embodiments of inventive concepts and FIGS. 8B to 8H, 9B to 9F, 10B to 10D, 11B, 12B to 12D, 13B to 13C, and 14B are longitudinal cross-sectional views taken along line B-B'.

Figure 8A:
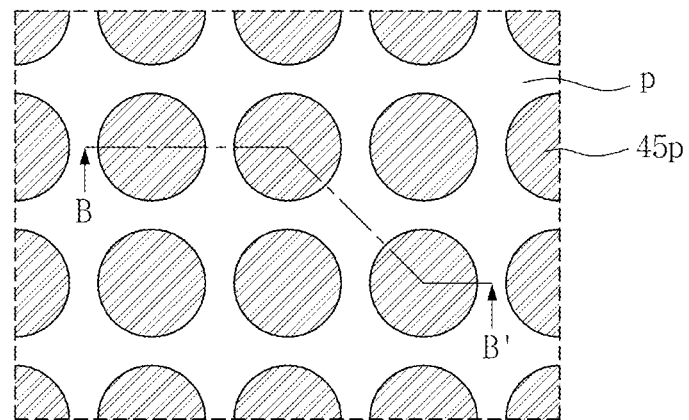
Figure 8B:
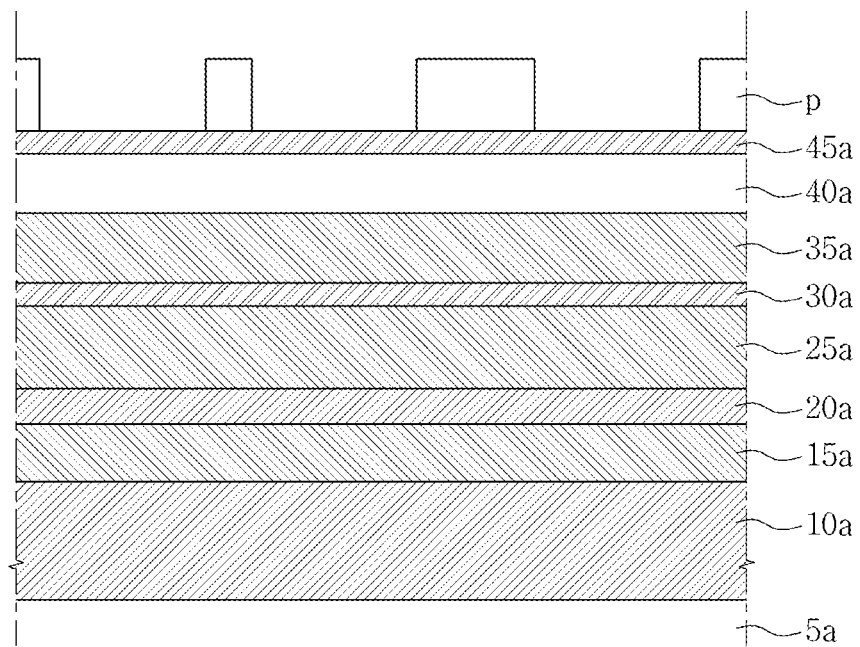
FIGS. 8B to 8H, 9B to 9F, 10B to 10D, 11B, 12B to 12D, 13B to 13C, and 14B are longitudinal cross-sectional views taken along line B-B' of FIGS. 8A, 9A, 10A, 11A, 12A, 13A, and 14A.

FIG. 8A is a layout diagram illustrating the method and FIG. 8B is a longitudinal cross-sectional view taken along line B-B'.

Referring to FIGS. 8A and 8B, the method may include sequentially forming a lower buffer mask layer 10a, a middle buffer mask layer 15a, an upper buffer mask layer 20a, a lower patterning mask layer 25a, a middle patterning mask layer 30a, an upper patterning mask layer 35a, a lower hard mask layer 40a, and an upper hard mask layer 45a on a target layer 5a in a stacking manner and forming a photoresist pattern P on the upper hard mask layer 45a. The photoresist pattern P may selectively expose the upper hard mask pattern layer 45a.

Figure 8C:
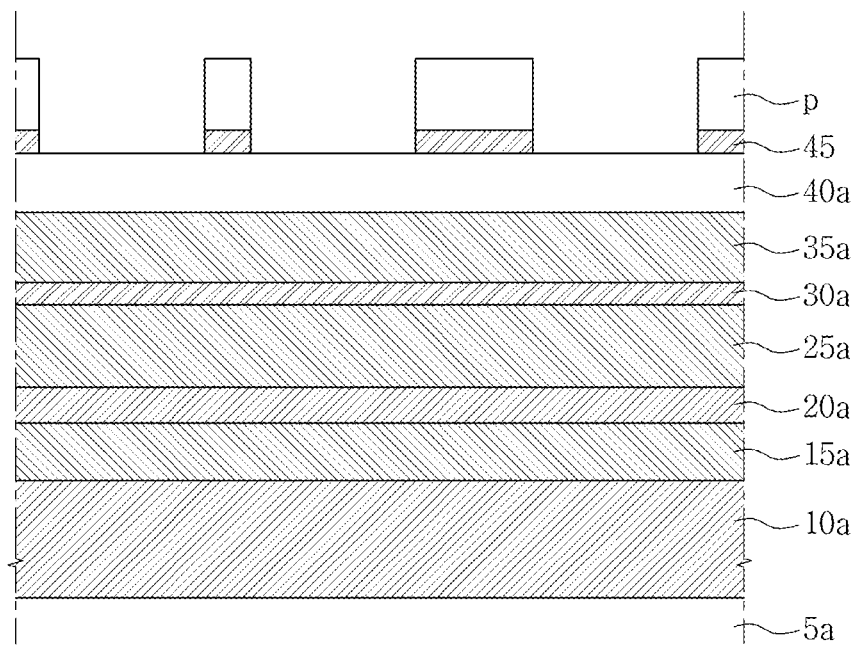

Referring to FIG. 8C, the method may include forming an upper hard mask pattern 45 selectively exposing the lower hard mask layer 40a by selectively removing the upper hard mask layer 45a using the photoresist pattern P as an etch mask.

Figure 8D:
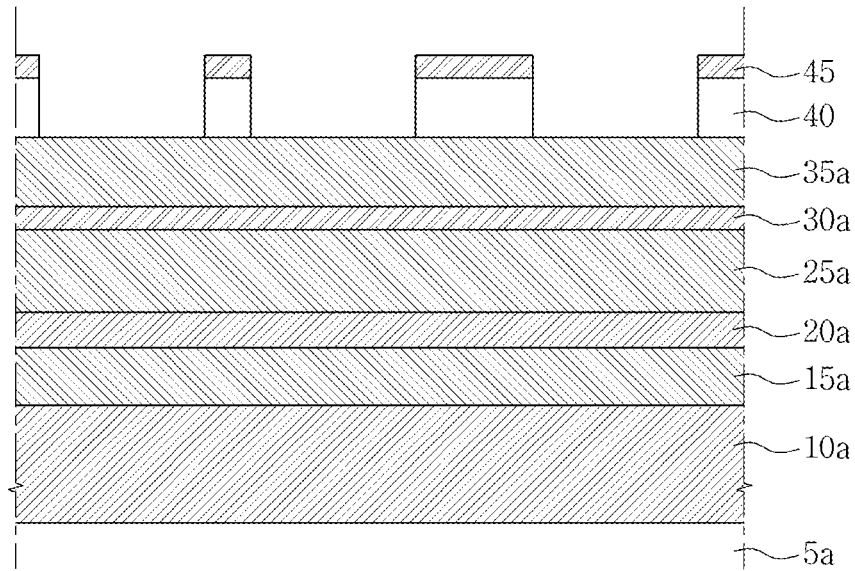

Referring to FIG. 8D, the method may include forming a lower hard mask pattern 40 selectively exposing the upper patterning mask layer 35a by selectively removing the lower hard mask layer 40a using the photoresist pattern P and the upper hard mask pattern 45 as an etch mask. When both of the photoresist pattern P and the lower hard mask layer 40a include a carbon polymer, the photoresist pattern P may not function as an etch mask for etching the lower hard mask layer 40a. For example, the photoresist pattern P and the lower hard mask layer 40a may be simultaneously removed. In the process, the photoresist pattern P may be completely removed.

Figure 8E:
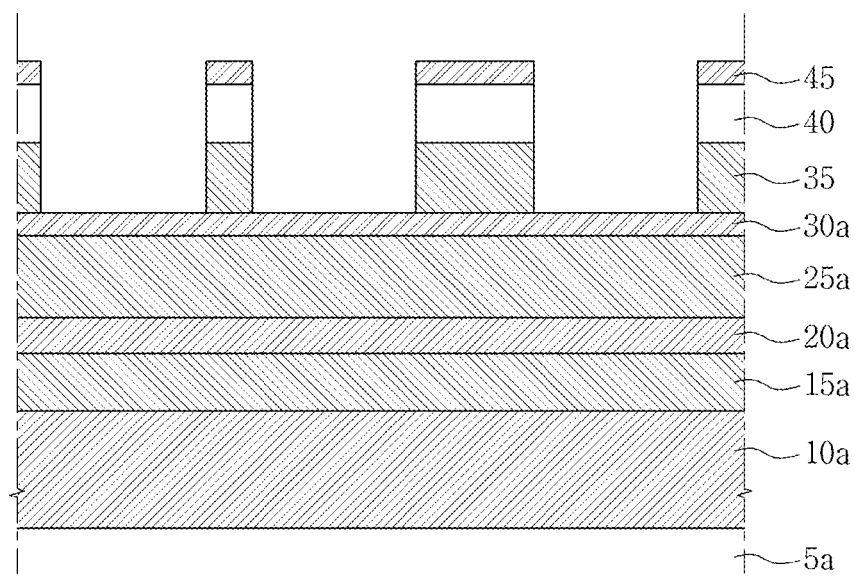

Referring to FIG. 8E, the method may include forming an upper patterning mask pattern 35 selectively exposing the middle patterning mask layer 30a by selectively removing the upper patterning mask layer 35a using the upper hard mask pattern 45 as an etch mask.

Figure 8F:
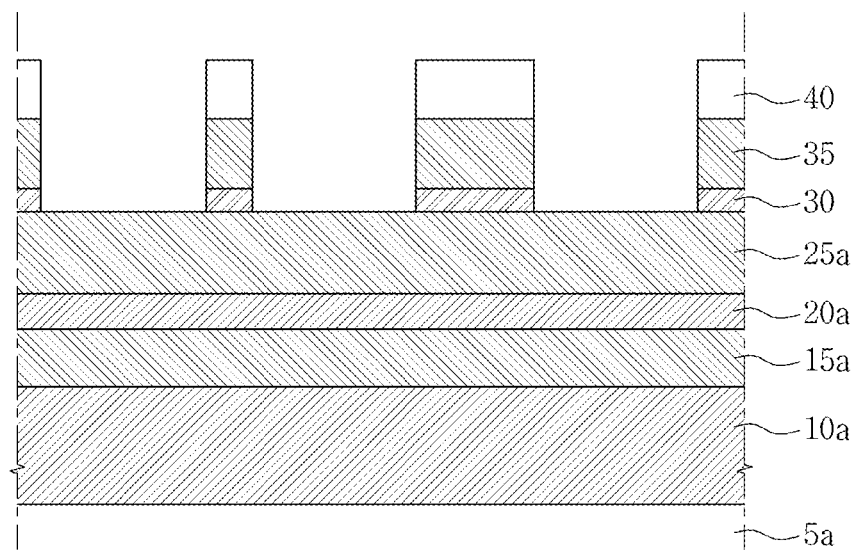

Referring to FIG. 8F, the method may include forming a middle patterning mask pattern 30 selectively exposing the lower patterning mask layer 25a by selectively removing the middle patterning mask layer 30a using the upper hard mask pattern 45 and the lower hard mask pattern 40 as an etch mask. When the upper hard mask pattern 45 and the middle patterning mask layer 30a include the same material, the upper hard mask pattern 45 may not function as an etch mask and be removed. In the process, the upper hard mask pattern 45 may be completely removed and the lower hard mask pattern 40 may be thinned.

Figure 8G:
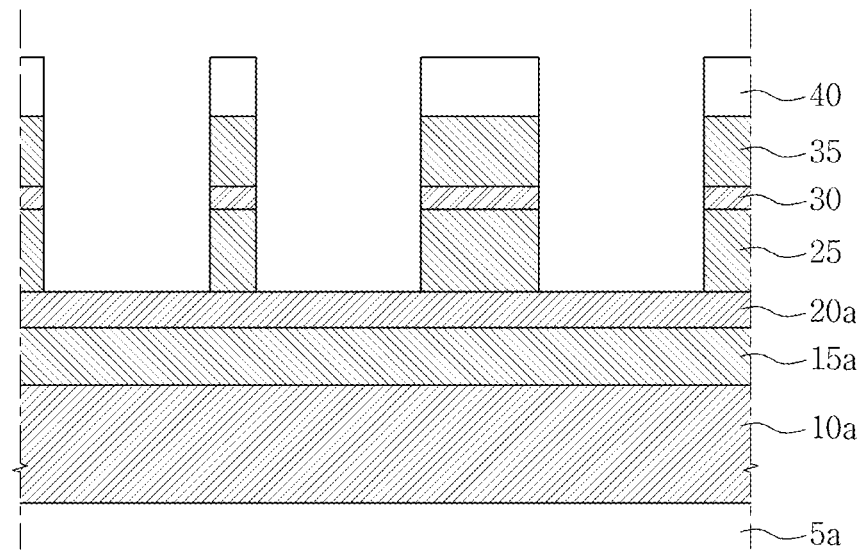

Referring to FIG. 8G, the method may include forming a lower patterning mask pattern 25 selectively exposing the upper buffer mask layer 20a by selectively removing the lower patterning mask layer 25a using the lower hard mask pattern 40 as an etch mask. In the process, the lower hard mask pattern 40 may be further thinned.

Figure 8H:
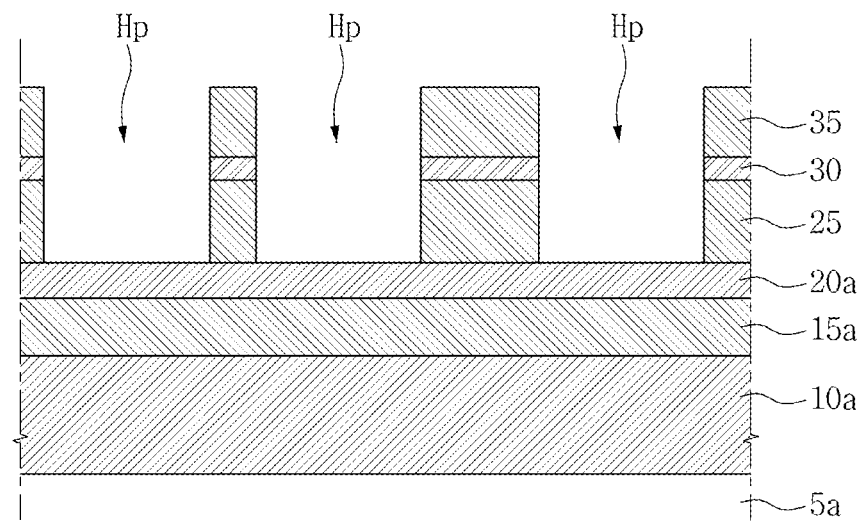

Referring to FIG. 8H, the method may include removing the lower hard mask pattern 40. For example, when the lower hard mask pattern 40 includes a carbon polymer, the lower hard mask pattern 40 may be removed by performing an ashing process using oxygen gas. The upper patterning mask pattern 35, the middle patterning mask pattern 30, and the lower patterning mask pattern 25 may define a preliminary hole Hp.

Figure 9A:
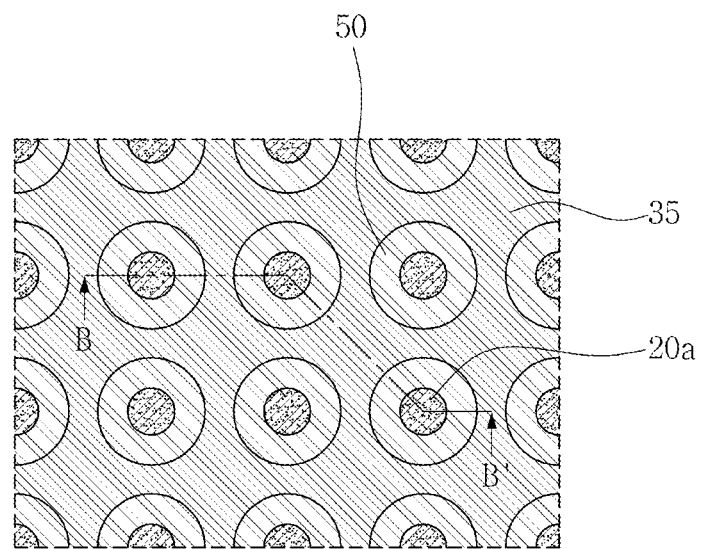
Figure 9B:
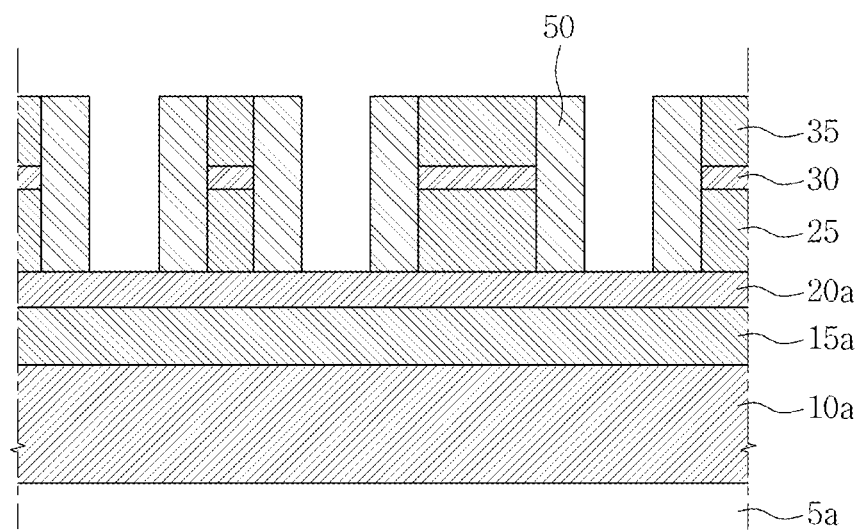

Referring to FIGS. 9A and 9B, the method may include forming an inner spacer 50 in the preliminary hole Hp. The forming of the inner spacer 50 may include entirely forming an inner spacer material layer and performing an etch back process to expose the upper buffer mask layer 20a in the preliminary hole Hp. For example, the inner spacer 50 may be formed on a sidewall of the preliminary hole Hp in a disc shape. The inner spacer 50 may include silicon nitride.

Figure 9C:
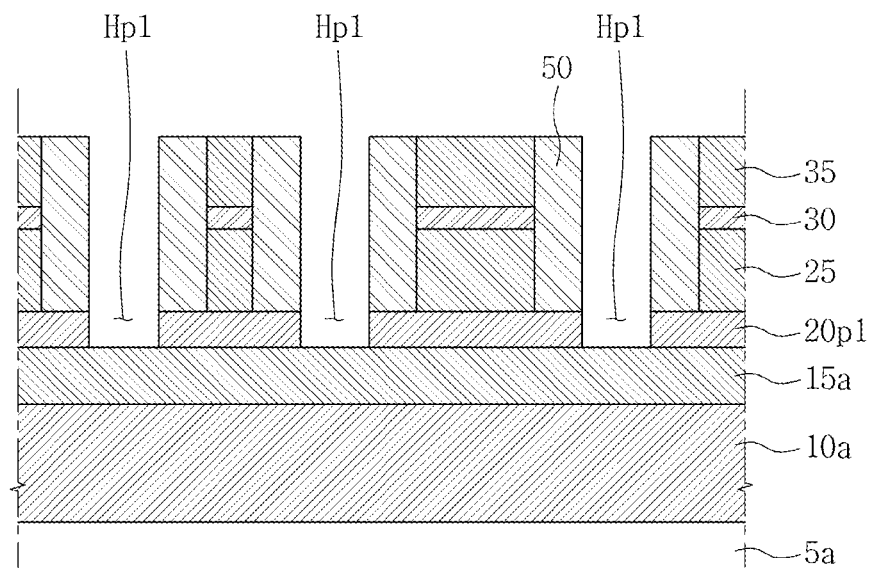

Referring to FIG. 9C, the method may include forming a first preliminary upper buffer mask pattern 20p1 having a first preliminary hole Hp1 selectively exposing the middle buffer mask layer 15a by selectively removing the upper buffer mask layer 20a using the upper patterning mask pattern 35 and the inner spacer 50 as an etch mask.

Figure 9D:
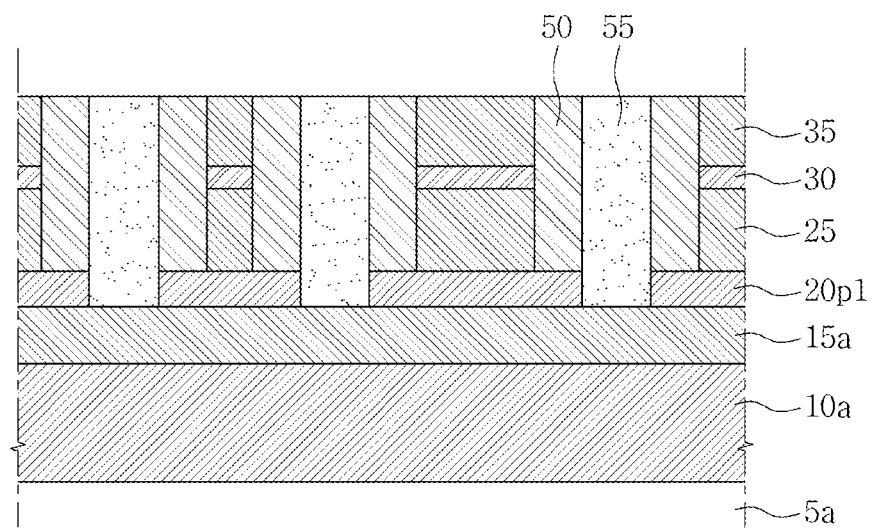

Referring to FIG. 9D, the method may include forming a core insulating pattern 55 in the first preliminary hole Hp1. The forming of the core insulating pattern 55 may include entirely forming a core insulating material to fill the first preliminary hole Hp1 and blanket-etching the core insulating material to expose upper surfaces of the upper patterning mask pattern 35 and inner spacer 50 by performing a planarization process such as an etch back process. The core insulating pattern 55 may include silicon nitride.

Figure 9E:
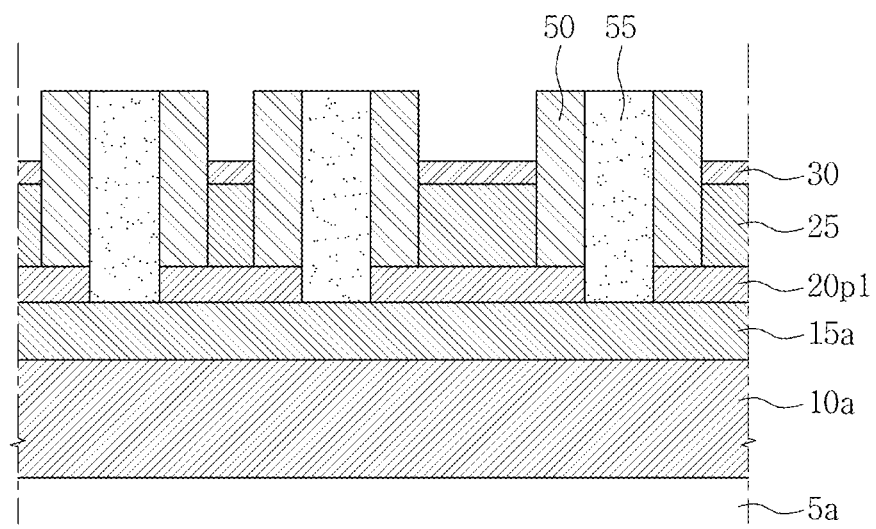

Referring to FIG. 9E, the method may include exposing an upper surface of the middle patterning mask pattern 30 and upper sides of the inner spacer 50 by removing the exposed upper patterning mask pattern 35.

Figure 9F:
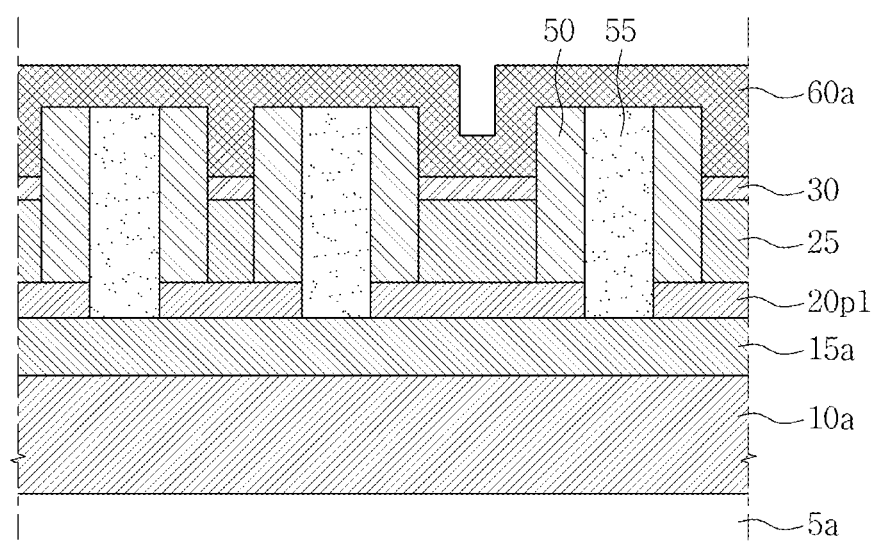

Referring to FIG. 9F, the method may include entirely forming an outer spacer material layer 60*a*. The outer spacer material layer 60*a* may be formed to be significantly filled in a relatively narrow region and may be conformably formed in a relatively wide region. The outer spacer material layer 60*a* may include silicon nitride.

Figure 10A:
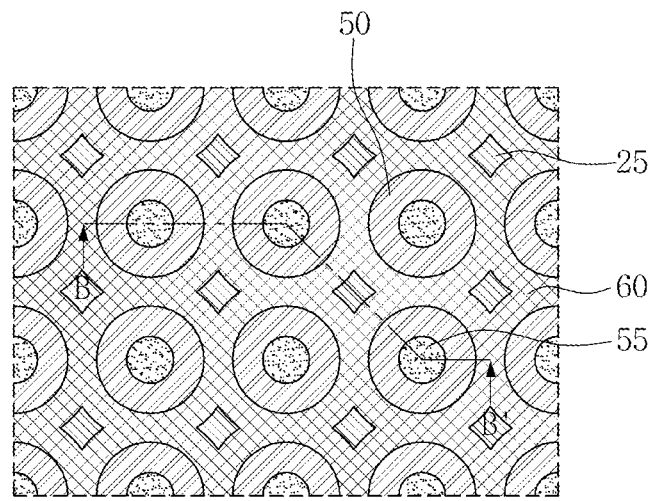
Figure 10B:
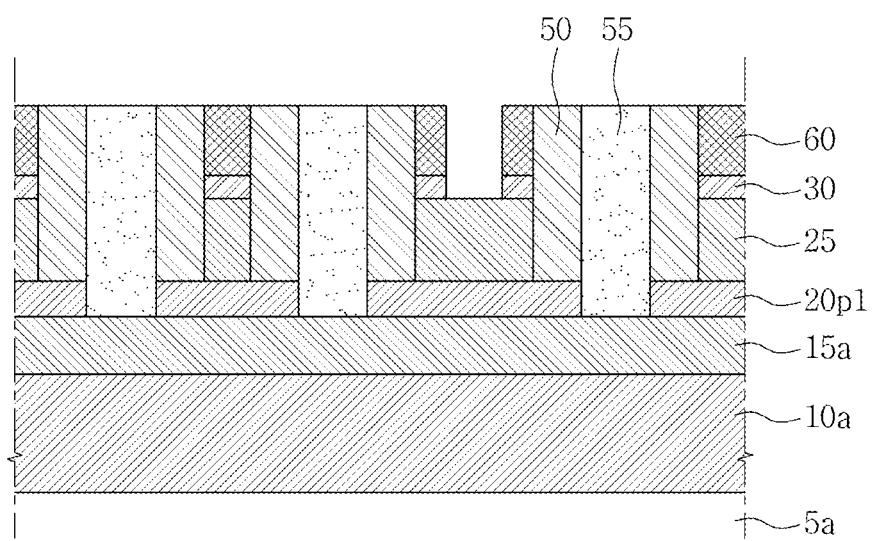

Referring to FIGS. 10A and 10B, the method may include forming an outer spacer 60 exposing an upper surface of the core insulating pattern 55, an upper surface of the inner spacer 50, and the middle patterning mask pattern 30 by etching back the outer spacer material layer 60*a*. The method may include continuously removing the exposed middle patterning mask pattern 30 to selectively expose an upper surface of the lower patterning mask pattern 25.

Figure 10C:
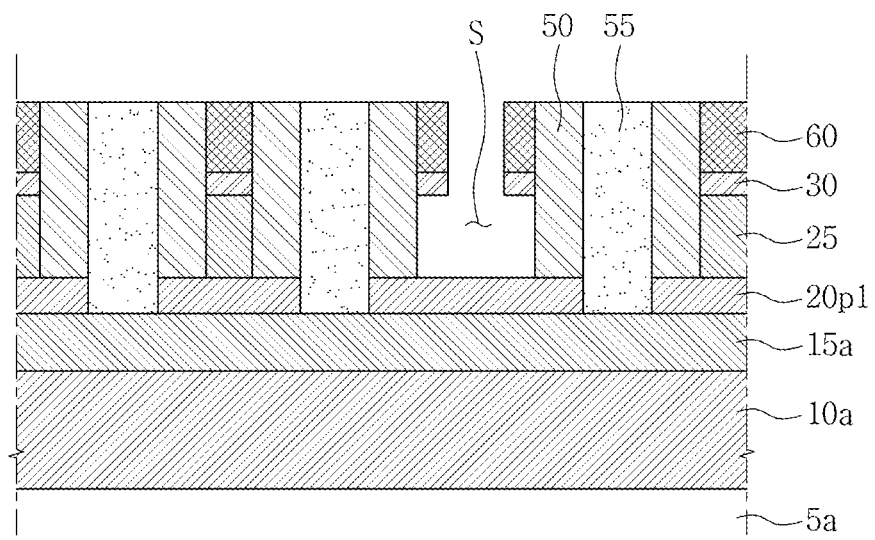

Referring to FIG. 10C, the method may include forming an empty space S by removing the exposed lower patterning mask pattern 25.

Figure 10D:
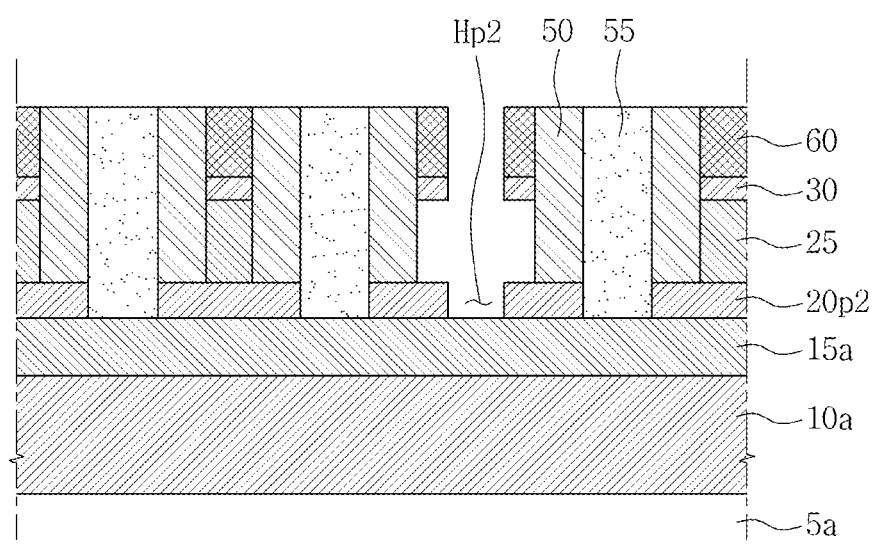

Referring to FIG. 10D, the method may include forming a second preliminary upper buffer mask pattern 20*p*2 having a second preliminary hole Hp2 exposing the middle buffer mask layer 15*a* by selectively removing the first preliminary upper buffer mask pattern 20*p*1 exposed in the empty space S.

Figure 11A:
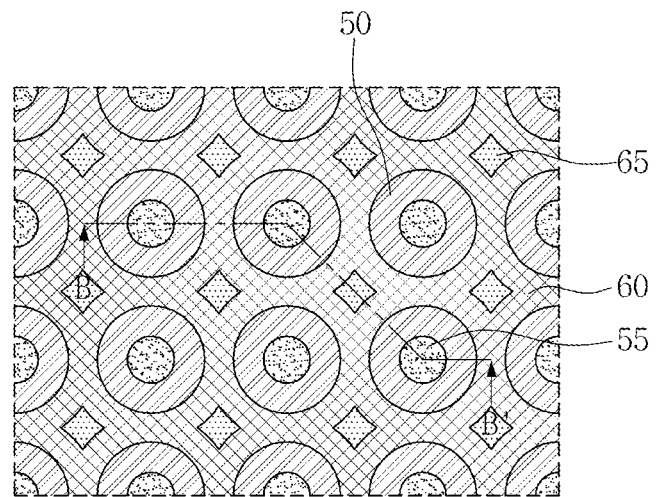
Figure 11B:
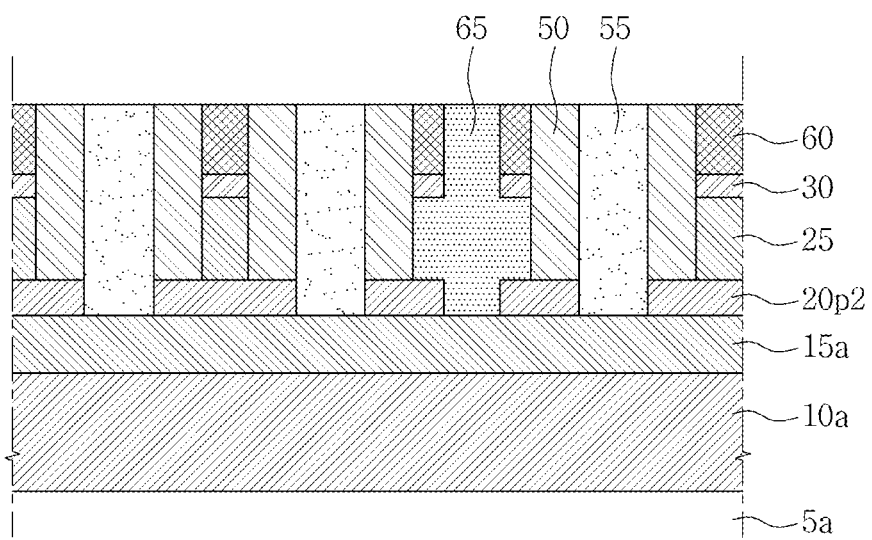

Referring to FIGS. 11A and 11B, the method may include forming a patterning barrier pattern 65 filling the second preliminary hole Hp2. The patterning barrier pattern 65 may include silicon nitride.

Figure 12A:
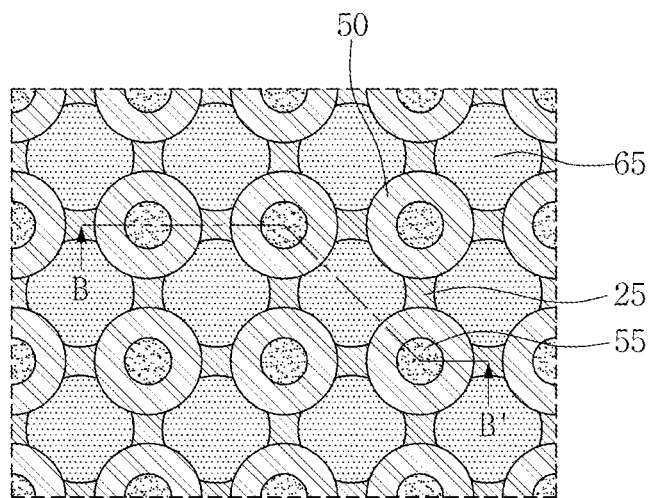
Figure 12B:
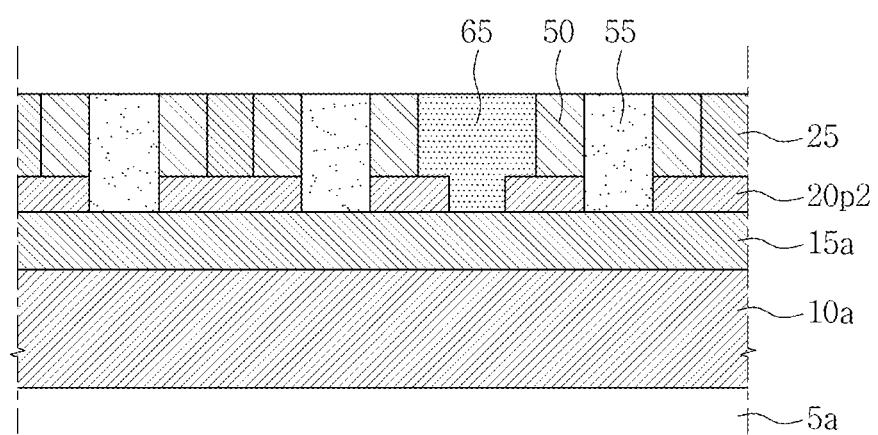

Referring to FIGS. 12A and 12B, the method may include entirely performing an etch back process to expose the lower patterning mask pattern 25. For example, the process may include etching back the inner spacer 50, the core insulating pattern 55, and the patterning barrier pattern 65 to remove the outer spacer 60 and the middle patterning mask pattern 30. The process may include performing an etching back process for removing silicon nitride.

Figure 12C:
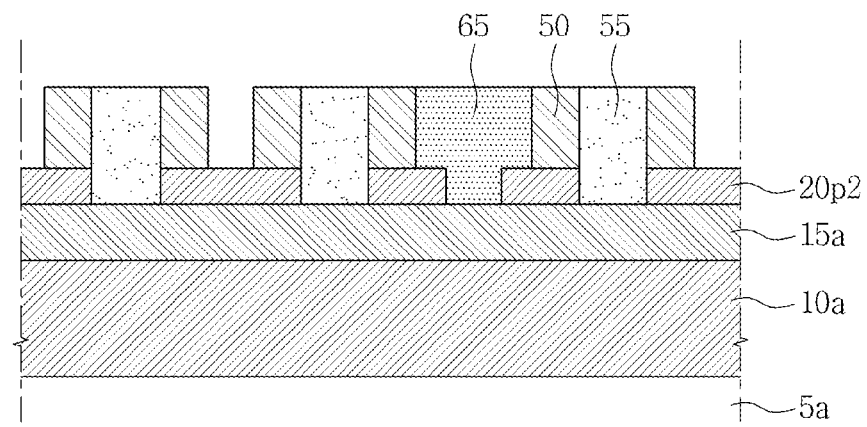

Referring to FIG. 12C, the method may include selectively exposing the second preliminary upper buffer mask pattern 20*p*2 by removing the exposed lower patterning mask pattern 25. The process may include performing a wet etch process using a hydrofluoric acid (HF).

Figure 12D:
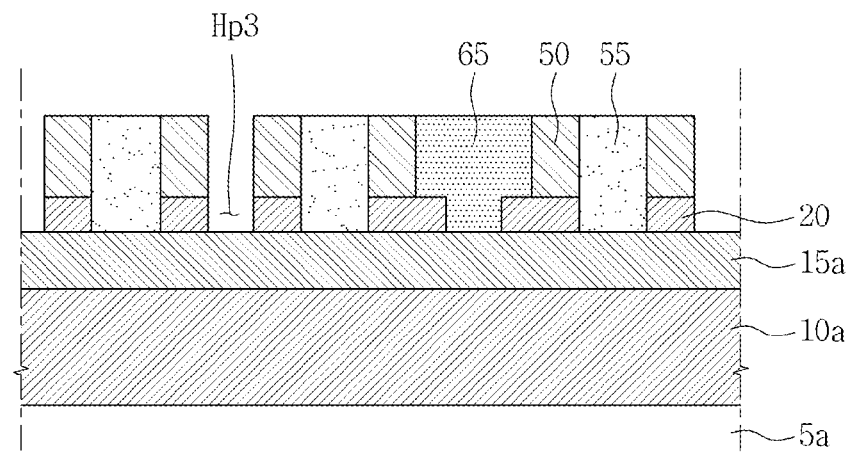

Referring to FIG. 12D, the method may include forming an upper buffer mask pattern 20 further having a third preliminary hole Hp3 exposing the middle buffer mask layer 15*a* by further selectively removing the exposed second preliminary upper buffer mask pattern 20*p*2.

Figure 13A:
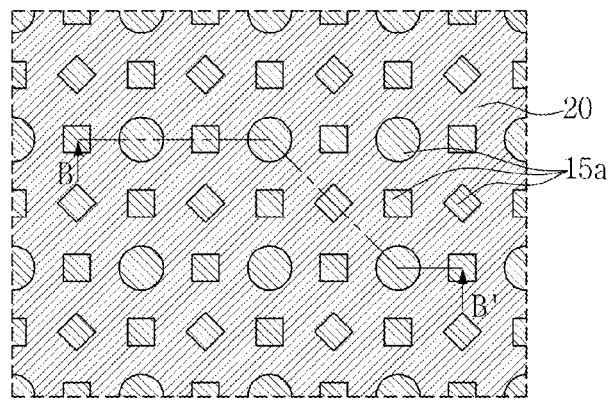
Figure 13B:
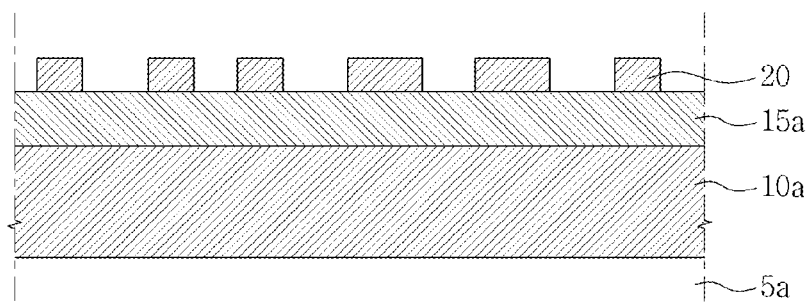

Referring to FIGS. 13A and 13B, the method may include exposing the upper buffer mask pattern 20 and the middle buffer mask layer 15*a* by removing the core insulating pattern 55, the inner spacer 50, and the patterning barrier pattern 65.

Figure 13C:
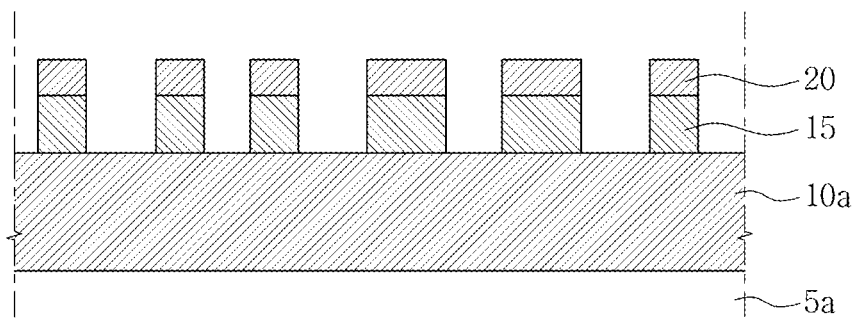

Referring to FIG. 13C, the method may include forming an middle buffer mask pattern 15 selectively exposing the lower buffer mask layer 10*a* by selectively removing the middle buffer mask layer 15*a* using the upper buffer mask pattern 20 as an etch mask.

Figure 14A:
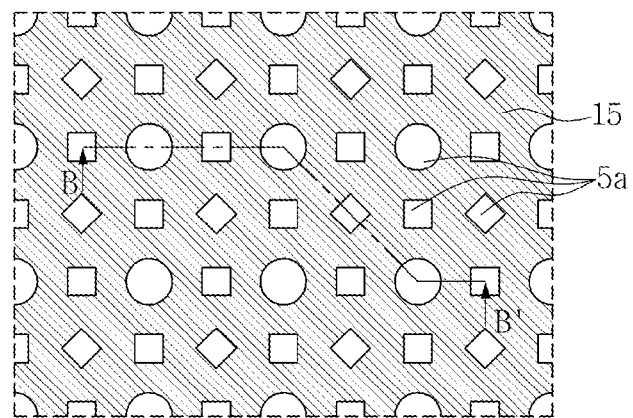
Figure 14B:
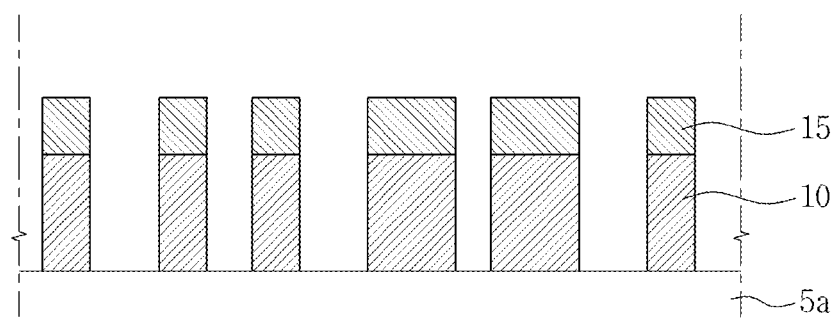

Referring to FIGS. 14A and 14B, the method may include forming a lower buffer mask pattern 10 selectively exposing the target layer 5*a* using the upper buffer mask pattern 20 and the middle buffer mask pattern 15 as an etch mask. When the upper buffer mask pattern 20 and the lower buffer mask pattern 10 include the same material, the upper buffer mask pattern 20 may not function as an etch mask for etching the lower buffer mask pattern 10. In the process, the upper buffer mask pattern 20 may be removed.

Figure 15:
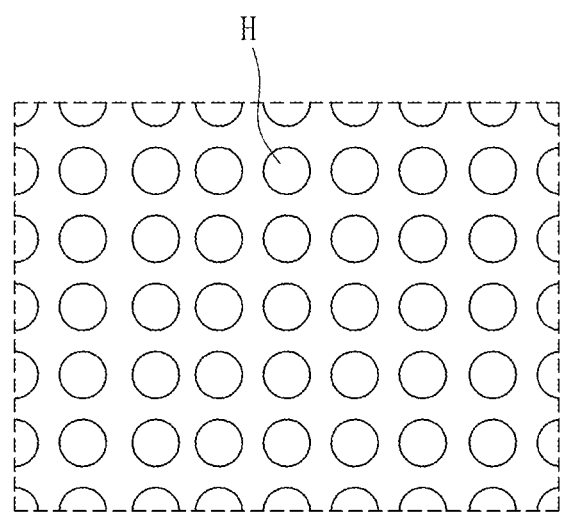

FIG. 15 is a layout diagram substantially interpreting FIG. 14A. Referring to FIG. 15, the method may include forming holes H arranged in a matrix form or a grid point form. In ideal layout diagrams, the holes H have a polygonal shape, but the holes H may be modified into a circular shape during the performing of the etching process.

The hole patterns formed by the various example embodiments of inventive concepts may have two times or more pattern density through multiple deposition/etching processes for hole patterns having a minimum pitch or a minimum diameter which can be formed by photolithography equipment. Therefore, degree of integration of the semiconductor devices may be improved and the hole patterns may be stably formed by simple processes since advanced photolithography processes for forming fine patterns may not be excessively used.

The methods of forming hole patterns of semiconductor devices according to various example embodiments may provide formation of high density hole patterns using one photolithography process and deposition and etch back processes of well-known materials without using high-priced semiconductor fabrication equipments, processes and materials.

Figure 16A:
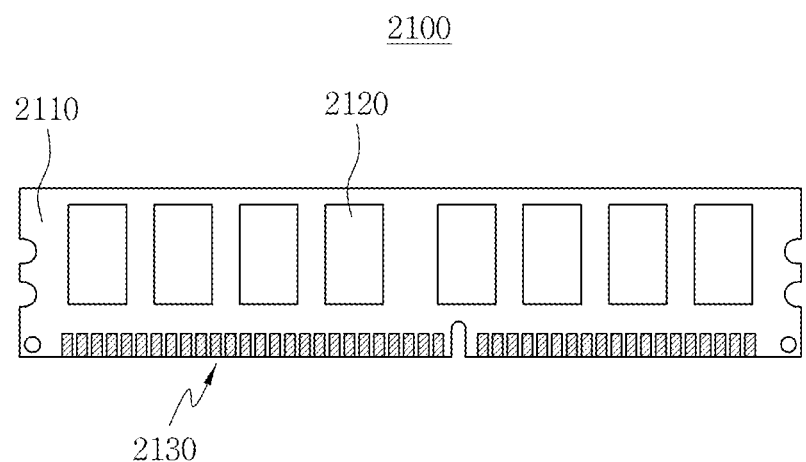
FIG. 16A is a view conceptually illustrating a memory module including a semiconductor device fabricated using a fabrication method according to example embodiments of inventive concepts.

FIG. 16A is a view conceptually illustrating a memory module including a semiconductor device fabricated using a fabrication method according to example embodiments of inventive concepts.

Referring to FIG. 16A, a memory module 2100 may include a memory module substrate 2110, and a plurality of memory devices 2120 and a plurality of terminals 2130 disposed on the memory module substrate 2110. The memory module substrate 2110 may include a printed circuit board (PCB) or a wafer. The memory devices 2120 may be the semiconductor device fabricated using a fabrication method according to example embodiments of inventive concepts or a semiconductor package including the semiconductor device. The plurality of terminals 2130 may include a conductive metal. Each of the terminals may be electrically connected to each of the memory devices 2120. Because the memory module 2100 includes the semiconductor device with low leakage current and good on/off current characteristics, module performance is improved.

Figure 16B:
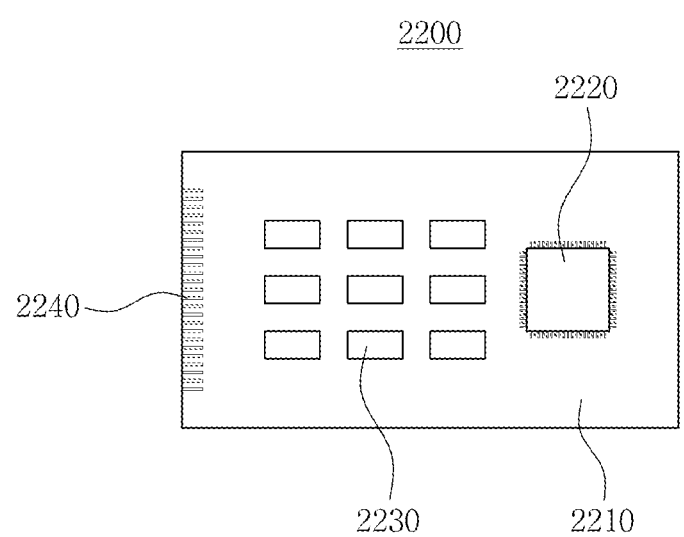
FIG. 16B is a view conceptually illustrating a memory card including a semiconductor device fabricated using a fabrication method according to example embodiments of inventive concepts.

FIG. 16B is a view conceptually illustrating a memory card including a semiconductor device fabricated using a fabrication method according to example embodiments of inventive concepts.

Referring to FIG. 16B, a memory card 2200 according to example embodiments of inventive concepts may include semiconductor devices 2230 including a semiconductor device mounted on a memory card substrate 2210 and fabricated using a fabrication method according to example embodiments of inventive concepts. The memory card 2200 may further include a microprocessor 2220 mounted on the memory card substrate 2210. Input/output terminals 2240 may be arranged on at least one side of the memory card substrate 2210.

Figure 16C:
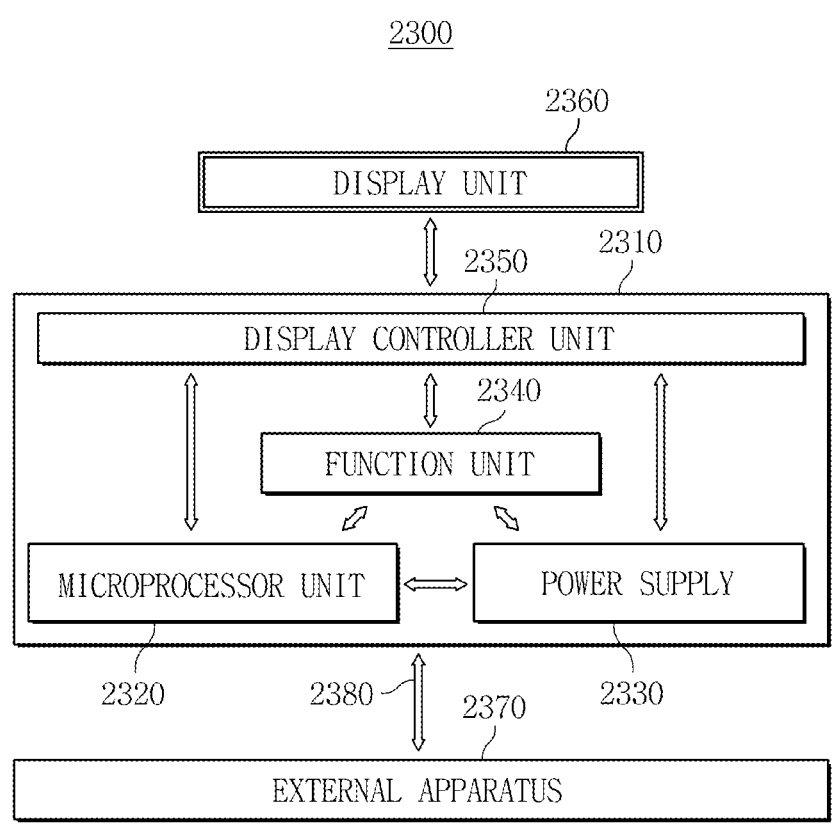
FIG. 16C is a view conceptually illustrating an electronic system including a semiconductor device fabricated using a fabrication method according to example embodiments of inventive concepts.

FIG. 16C is a block diagram conceptually illustrating an electronic system including a semiconductor device fabricated using a fabrication method according to example embodiments of inventive concepts.

Referring to FIG. 16C, a semiconductor device fabricated using a fabrication method according to example embodiments of inventive concepts may be applied to an electronic system 2300. The electronic system 2300 may include a body 2310. The body 2310 may include a microprocessor unit 2320, a power supply 2330, a function unit 2340, and/or a display controller unit 2350. The body 2310 may be a system board or motherboard including a PCB. The microprocessor unit 2320, the power supply 2330, the function unit 2340, and the display controller unit 2350 may be mounted or installed on the body 2310. A display unit 2360 may be disposed on a top surface or in an outside of the body 2310. For example, the display unit 2360 may be disposed on a surface of the body 2310 and display an image processed by the display controller unit 2350. The power supply 2330 may receive a constant voltage from an external power source, etc., divide the voltage into various levels, and supply those voltages to the microprocessor unit 2320, the function unit 2340, and the display controller unit 2350. The microprocessor unit 2320 may receive a voltage from the power supply 2330 to control the function unit 2340 and the display unit 2360. The function unit 2340 may perform various functions of the electronic system 2300. For example, when the electronic system 2300 is a mobile electronic apparatus such as a mobile phone, the function unit 2340 may have several components which can perform functions of wireless communication such as video output to the display unit 2360 or sound output to a speaker through dialing or communication with an external apparatus 2370, and when a camera is installed, the function unit 2340 may function as an image processor. In other example embodiments, when the electronic system 2300 is connected to a memory card, etc. in order to expand capacity, the function unit 2340 may be a memory card controller. The function unit 2340 may exchange signals with the external apparatus 2370 through a wired or wireless communication unit 2380. In addition, when the electronic system 2300 needs a universal serial bus (USB), etc. in order to expand functionality, the function unit 2340 may function as an interface controller. At least one of the microprocessor unit 2320 and the function unit 2340 may include a semiconductor device fabricated using a fabrication method according to example embodiments of inventive concepts.

Figure 16D:
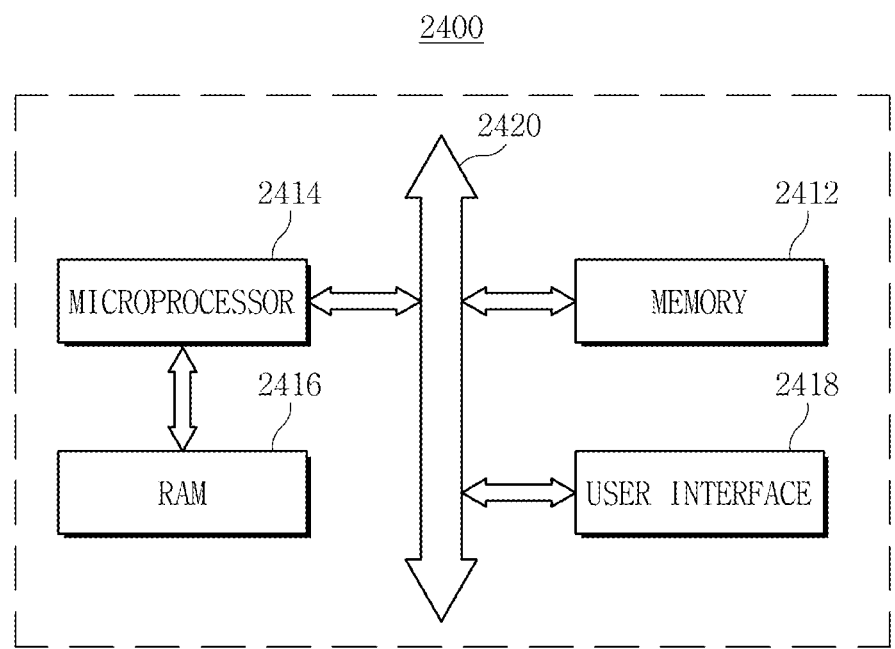
FIG. 16D is a block diagram schematically illustrating another electronic system including a semiconductor device fabricated using a fabrication method according to example embodiments of inventive concepts.

FIG. 16D is a block diagram schematically illustrating another electronic system including a semiconductor device fabricated using a fabrication method according to example embodiments of inventive concepts.

Referring to FIG. 16D, an electronic system 2400 may include a semiconductor device fabricated using a fabrication method according to example embodiments of inventive concepts. The electronic system 2400 may be used to fabricate a mobile apparatus or a computer. For example, the electronic system 2400 may include a memory system 2412, a microprocessor 2414 performing data communication using a bus 2420, a random access memory (RAM) 2416, and a user interface 2418. The microprocessor 2414 may program and control the electronic system 2400. The RAM 2416 may be used as an operation memory of the microprocessor 2414. For example, the microprocessor 2414 or the RAM 2416 may include a semiconductor device fabricated using a fabrication method according to example embodiments of inventive concepts. The microprocessor 2414, the RAM 2416, and/or other components may be assembled in a single package. The user interface 2418 may be used to input/output data to/from the electronic system 2400. The memory system 2412 may store codes for operating the microprocessor 2414, data processed by the microprocessor 2414, or external input data. The memory system 2412 may include a controller and a memory device.

Figure 16E:
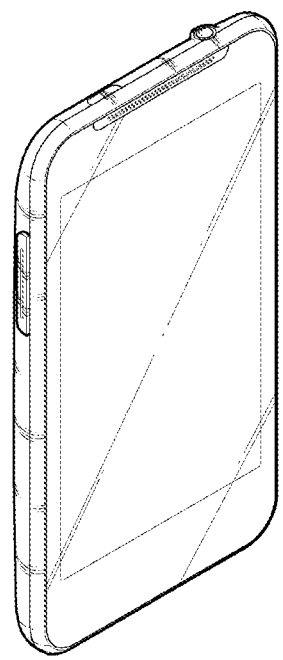
FIG. 16E is a block diagram schematically illustrating a mobile wireless phone including a semiconductor device fabricated using a fabrication method according to example embodiments of inventive concepts.

FIG. 16E is a view schematically illustrating a mobile wireless phone including a semiconductor device fabricated using a fabrication method according to example embodiments of inventive concepts.

Referring to FIG. 16E, a mobile wireless phone 2500 may be understood as a tablet PC. In addition, a semiconductor device fabricated using a fabrication method according to example embodiments of inventive concepts may be used in a portable computer such as a notebook, an MPEG-1 Audio Layer 3 (MP3) player, an MP4 player, a navigation apparatus, a solid state disk (SSD), a desktop computer, an automobile, or a home appliance, as well as a tablet PC.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of forming hole patterns, the method comprising:
    sequentially stacking an upper patterning mask layer, a middle patterning mask layer, a lower patterning mask layer, and an upper buffer mask layer on a target layer;
    forming an upper patterning mask pattern, a middle patterning mask pattern, and a lower patterning mask pattern which collectively define a preliminary hole selectively exposing an upper surface of the upper buffer mask layer by selectively removing the upper patterning mask layer, the middle patterning mask layer, and the lower patterning mask layer;
    forming an inner spacer exposing a portion of the upper surface of the upper buffer mask layer on an inner wall of the preliminary hole;
    forming an upper buffer mask pattern by removing the exposed portion of the upper surface of the upper buffer mask layer using the upper patterning mask pattern and the inner spacer as an etch mask;
    forming a core insulating pattern filling the preliminary hole;
    exposing a portion of an outer side of the inner spacer and the middle patterning mask pattern by removing the upper patterning mask pattern;
    forming an outer spacer on the exposed portion of the outer side of the inner spacer, wherein the outer spacer exposes a portion of the middle patterning mask pattern;
    selectively exposing a first portion of the lower patterning mask pattern by removing the exposed portion of the middle patterning mask pattern;
    forming an empty space selectively exposing a first portion of the upper buffer mask pattern by removing the exposed first portion of the lower patterning mask pattern;
    forming a patterning barrier pattern in the empty space;
    exposing a second portion of the lower patterning mask pattern by removing the outer spacer and the middle patterning mask pattern;
    exposing a second portion of the upper buffer mask pattern by removing the exposed second portion of the lower patterning mask pattern;
    removing the exposed second portion of the upper buffer mask pattern; and
    removing the core insulating pattern, the inner spacer, and the patterning barrier pattern.

2. The method of claim 1, further comprising:
forming a lower hard mask layer on the upper patterning mask layer;
forming an upper hard mask layer on the lower hard mask layer;
forming a photoresist pattern on the upper hard mask layer;
forming the upper hard mask pattern selectively exposing the lower hard mask layer by selectively removing the upper hard mask layer using the photoresist pattern as an etch mask; and
forming the lower hard mask pattern selectively exposing the upper patterning mask layer by selectively removing the lower hard mask layer using the upper hard mask pattern as an etch mask.

3. The method of claim 2, wherein the lower hard mask pattern includes a carbon polymer, and
the upper hard mask pattern includes a silicon oxynitride layer.

4. The method of claim 1, further comprising, between the target layer and the upper buffer mask layer:
forming the lower buffer mask layer and a middle buffer mask layer;
forming a middle buffer mask pattern by selectively removing the middle buffer mask layer using the upper buffer mask pattern as an etch mask; and
forming a lower buffer mask pattern by selectively removing the lower buffer mask layer using the middle buffer mask pattern as an etch mask.

5. The method of claim 4, wherein the upper buffer mask layer and the lower buffer mask layer include polycrystalline silicon, and
the middle buffer mask layer includes silicon oxide.

6. The method of claim 1, wherein the selectively exposing of the first portion of the upper buffer mask pattern includes removing a portion of the lower patterning mask pattern disposed below the middle patterning mask pattern.

7. The method of claim 1, wherein the exposing of the second portion of the lower patterning mask pattern includes partially removing an upper portion of the core insulating pattern and an upper portion of the inner spacer.

8. The method of claim 1, wherein the upper patterning mask layer and the lower patterning mask layer include silicon oxide.

9. The method of claim 1, wherein the middle patterning mask layer, the inner spacer, the outer spacer, the core insulating pattern, and the patterning barrier pattern include silicon nitride.

10. A method of forming hole patterns, the method comprising:
forming a buffer mask layer on a target layer;
forming a patterning mask pattern defining a preliminary hole exposing an upper surface of the buffer mask layer;
forming an inner spacer exposing a portion of the upper surface of the buffer mask layer on an inner wall of the preliminary hole;
forming a buffer mask pattern having a first hole by removing the portion of the upper surface of the buffer mask layer exposed in the preliminary hole using the patterning mask pattern and the inner spacer as an etch mask;
forming a core insulating pattern filling the preliminary hole and the first hole;
exposing a portion of an outer side of the inner spacer by partially removing an upper portion of the patterning mask pattern;
forming an outer spacer to expose a first portion of the patterning mask pattern on the exposed portion of the outer side of the inner spacer;
forming an empty space exposing a first portion of the buffer mask pattern by partially removing the patterning mask pattern using the outer spacer as an etch mask;
forming a patterning barrier pattern in the empty space;
exposing a second portion of the patterning mask pattern by removing the outer spacer;
exposing a second portion of the buffer mask pattern by removing the second portion of the patterning mask pattern using the inner spacer and the core insulating pattern as an etch mask; and
forming a second hole by removing the second portion of the buffer mask pattern.

11. The method of claim 10, further comprising:
forming a third hole by removing the first portion of the buffer mask pattern before the forming of the patterning barrier pattern.

12. The method of claim 10, wherein the forming of the patterning mask pattern includes,
sequentially stacking a lower patterning mask layer, a middle patterning mask layer, and an upper patterning mask layer on the buffer mask layer; and
forming an upper patterning mask pattern, a middle patterning mask pattern, and a lower patterning mask pattern by selectively removing the upper patterning mask layer, the middle patterning mask layer, and the lower patterning mask layer.

13. The method of claim 12, wherein the exposing of the portion of the outer side of the inner spacer by partially removing the upper portion of the patterning mask pattern includes removing the upper patterning mask pattern.

14. The method of claim 13, wherein the removing of the second portion of the patterning mask pattern includes removing a portion of the middle patterning mask pattern and a portion of the lower patterning mask pattern.

15. The method of claim 11, wherein the portion of the upper surface of the buffer mask layer forms a bottom surface of the preliminary hole, and
the first portion and the second portion of the buffer mask pattern are disposed outside of the preliminary hole.

16. A method of forming hole patterns, comprising:
providing a buffer mask layer and a patterning mask pattern sequentially stacked over an upper surface of a target layer, wherein the buffer mask layer defines a bottom surface of a preliminary hole, and the patterning mask pattern defines sidewalls of the preliminary hole;
forming inner spacers each on a first portion of the buffer mask layer and each covering one of the sidewalls of the preliminary hole;
forming a first buffer mask pattern by removing a second portion of the buffer mask layer using the patterning mask pattern and the inner spacers as an etch mask, wherein the second portion of the buffer mask layer excludes the first portion of the buffer mask layer;
forming a core insulating pattern filling the preliminary holes and areas between the first buffer mask pattern;
exposing a sidewall of each of inner spacers by partially removing an upper portion of the patterning mask pattern;
forming outer spacers on the exposed sidewalls of the inner spacers, wherein the outer spacers expose a middle portion of the patterning mask pattern;
forming an empty space by partially removing the middle portion and a bottom portion of the patterning mask pattern using the outer spacers as an etch mask;
forming a patterning barrier pattern in the empty space; and forming a second buffer mask pattern by separately etching a top surface and a bottom surface of a remaining portion of the buffer mask layer using the first buffer mask pattern as an etching mask.

17. The method of claim 16, wherein the outer spacers are each formed having a width less than a width of each of the inner spacers, and
the exposed middle portion of the patterning mask pattern has a substantially triangular shape in plan view.

18. The method of claim 17, wherein the second buffer mask pattern has a plurality of holes collectively forming a repeating pattern in plan view,
the repeating pattern consists of a first hole having a substantially circle shape in plan view and a plurality of second holes encircling the first hole, and
the plurality of second holes is identical and each has a substantially rectangular shape in plan view.

19. The method of claim 16, wherein the forming outer spacers includes forming an outer spacer material layer partially filling in a substantial portion of an area between the exposed sidewalls of the inner spacers; and
the exposed middle portion of the patterning mask pattern has a substantially square shape in plan view.

20. The method of claim 19, wherein the second buffer mask pattern has a plurality of holes collectively forming a repeating pattern in plan view,
the repeating pattern consists of a first hole having a substantially circle shape in plan view and a plurality of second holes encircling the first hole, and
the plurality of second holes consists of alternating square-shaped holes and triangular-shaped holes in plan view.

* * * * *